United States Patent [19]

Lagree et al.

[11] Patent Number: 4,747,061

[45] Date of Patent: May 24, 1988

[54] AUTOMATIC TRANSFER SWITCH FOR A WIDE RANGE OF SOURCE VOLTAGE

[75] Inventors: James L. Lagree, Plum Borough; Joseph C. Engel, Monroeville Boro, both of Pa.

[73] Assignee: Westinghouse Electric Corp., Pittsburgh, Pa.

[21] Appl. No.: 840,270

[22] Filed: Mar. 17, 1986

[51] Int. Cl.⁴ .................. G01R 21/00; H02H 3/26
[52] U.S. Cl. .................................. 364/483; 361/88; 361/86; 335/20; 324/415; 323/234
[58] Field of Search ............... 364/480, 481, 483, 492; 361/33, 79, 86, 87, 90, 88; 335/2, 20, 155; 324/415, 416; 323/234, 212

[56] References Cited

U.S. PATENT DOCUMENTS

| | | | |
|---|---|---|---|
| 3,936,782 | 2/1976 | Moakler et al. | 335/161 |
| 4,189,649 | 2/1980 | Przywozny et al. | 307/64 |
| 4,344,143 | 8/1982 | Kurosawa et al. | 364/492 |
| 4,432,061 | 2/1984 | Herklotz et al. | 364/480 |
| 4,453,117 | 6/1984 | Elms et al. | 318/778 |
| 4,541,058 | 9/1985 | Andow et al. | 361/79 |
| 4,622,640 | 11/1986 | Shimamura et al. | 364/483 |
| 4,672,501 | 6/1987 | Bilac et al. | 364/483 |

OTHER PUBLICATIONS

"Westinghouse Transfer Switches", SA-10915 by the Westinghouse Electric Corporation, Low Voltage Breaker Division.
"Engineering Data Automatic Transfer Switch", Bulletin ATS-100A, Russelectric, Inc., May, 1984.
"Zenith ZTS Transfer Switches", Bulletin 0-5021 (Rev. 2), Zenith Controls, Inc.
"Automatic Transfer Switches", Bulletin SP-44, Square D Company.
"Pow-R-Tran TM Solid State Automatic Transfer Controller", Catalog Section 31-550, Dec. 6, 1976.

Primary Examiner—Parshotam S. Lall
Assistant Examiner—Brian M. Mattson
Attorney, Agent, or Firm—M. J. Moran

[57] ABSTRACT

An automatic transfer switch is taught which includes as part thereof a voltage sensing device which is interconnected with one of the lines to be monitored and controlled by the automatic transfer switch and neutral. This voltage may vary over a wide range and it is desired to provide a universal transfer switch control for operation over the wide range. The output analog voltage is provided to an analog-to-digital converter which has a maximum number of output bits. In order to keep the resolution of the output digital signal from the analog converter as high as possible, it is necessary to range the input voltage according to a menu of potential ranging values which are stored in the memory of a microprocessor. A programming device is utilized to input the line voltage and the microprocessor determines the maximum value for the ranging constant as a function thereof. The output analog voltage is reduced by this factor then provided to the analog-to-digital converter. The greater the reduction, the lower the sensitivity. However, the microprocessor chooses only that amount of discrete reduction necessary to prevent the expected input line voltage from exceeding the maximum digital output capacity of the A-to-D converter. The output of the A-to-D converter is then supplied to the microprocessor for processing and the amount of reduction is compensated for by multiplying the output signal by the increase of the conversion factor.

7 Claims, 23 Drawing Sheets

AUTOMATIC TRANSFER SWITCH FOR A WIDE RANGE OF SOURCE VOLTAGE

BACKGROUND OF THE INVENTION

The subject matter of this invention relates generally to automatic transfer switches (ATS) and more particularly to microprocessor-controlled automatic transfer switches.

FIELD OF THE INVENTION

Automatic transfer switch devices are described, for example, in U.S. Pat. No. 3,936,782 issued Feb. 3, 1976 to Moakler et al. and entitled "Automatic Transfer Switch" and U.S. Pat. No. 4,189,649 issued Feb. 19, 1980 to Przywozny et al. entitled "Control Panel for Automatic Transfer Switch". Examples of automatic transfer switches and control devices associated therewith are also described in the following brochures:

"WESTINGHOUSE TRANSFER SWITCHES," SA-10915 by the Westinghouse Electric Corporation, Low Voltage Breaker Division.

"ENGINEERING DATA AUTOMATIC TRANSFER SWITCH," Bulletin ATS-100A, Russelectric, Inc., May, 1984.

"ZENITH ZTS TRANSFER SWITCHES," Bulletin 0-5021 (REV. 2), Zenith Controls, Inc.

"AUTOMATIC TRANSFER SWITCHES," Bulletin SP-44, Square D Company.

"POW-R-TRAN ™ SOLID STATE AUTOMATIC TRANSFER CONTROLLER", Catalog Section 31-550, Dec. 6, 1976, Westinghouse Electric Corporation, Distribution Equipment Division.

Automatic transfer switches are devices that switch a power source for a load from a primary to a secondary source automatically or after manual operation for any number of important reasons. Automatic transfer systems are often found in hospitals, subways, schools, airports, office buildings and other commercial structures equipped with secondary power sources. Basically, automatic transfer systems come in either of two different types. One utilizes a double-throw contactor device while the other type utilizes circuit breakers as the primary switching devices. Furthermore, some kinds of automatic transfer switches systems utilize relay logic exclusively in the control portion thereof. Other types of automatic transfer switch systems utilize solid-state circuit devices to replace the relay devices. In addition, there are automatic transfer controllers which can be used in conjunction with separate automatically operated circuit switching devices such as circuit breakers, or fused or unfused switches. The controller supplies the intelligence to these primary switching devices when automatic transfer of load from one source to another becomes necessary. None of the known automatic transfer switch systems use microprocessor control. It would be advantageous to find an automatic transfer switch or switch system which utilized microprocessor control.

It is known to utilize microprocessor control in other types of circuit systems or devices such as motor control apparatus. An example of such a device is described in U.S. Pat. No. 4,453,117 issued June 5, 1984 to R. T. Elms et al. and entitled "Motor Control Apparatus with Short Term Undervoltage Motor Mode Saver".

It would be advantageous to have a simple microprocessor-controlled automatic transfer switch controller which could be universally utilized on either the contactor type of system or the circuit breaker type of system.

Automatic transfer switches are usually designed to work over a wide range of system voltage. This means that one automatic transfer switch can be universally used on a 400-volt system or a 600-volt system, for example. With electromechanical systems of that type the voltage is sensed by multi-tap voltage transformers. Once the operating system voltage is known, the taps are appropriately wired so that the overall system voltage for the controller is appropriate. With microprocessor-controlled systems, however, it may be possible to eliminate the use of a tapped input system if proper voltage ranging can be accomplished by utilizing the microprocessor and an input programming device. It would be advantageous if such a system could be found.

SUMMARY OF THE INVENTION

In accordance with the invention, an electrical transfer switch of the type which performs an electrical function like source switching as the result of sensed line voltage is taught. A voltage sensing arranging means is taught which is interconnected with the line for providing an output analog voltage which is related to the sensed voltage by a ranging value $1/K$. An analog-to-digital converter is interconnected with the voltage sensing and ranging means to receive the output analog voltage and to convert it to a digital number, the maximum value of which is limited to Q bits. An input device is provided for inputting a value of a signal indicative of the maximum expected value of the line voltage. A microprocessor with memory is interconnected with the voltage sensing and ranging device, the analog-to-digital converter, and the input device for determining the highest value of K from a predetermined menu of discrete values of K contained within the memory of the microprocessor. The choice for the value of K is such that the highest value of K is chosen which will provide a range of digital numbers which are related to the sensed line voltage, but wherein none of the digital numbers will exceed Q bits. The microprocessor internally multiplies the digital number by K to thus compensate for the previous reduction in the sensing and ranging means by the factor $1/K$.

BRIEF DESCRIPTION OF THE DRAWING

For a better understanding of the invention, reference may be had to the preferred embodiment thereof shown in the accompanying drawings in which:

FIGS. 5A through 5L show a schematic block diagram of the main controller of the embodiments of FIG. 3 and FIG. 4;

DESCRIPTION OF THE PREFERRED EMBODIMENT

Figure 1:
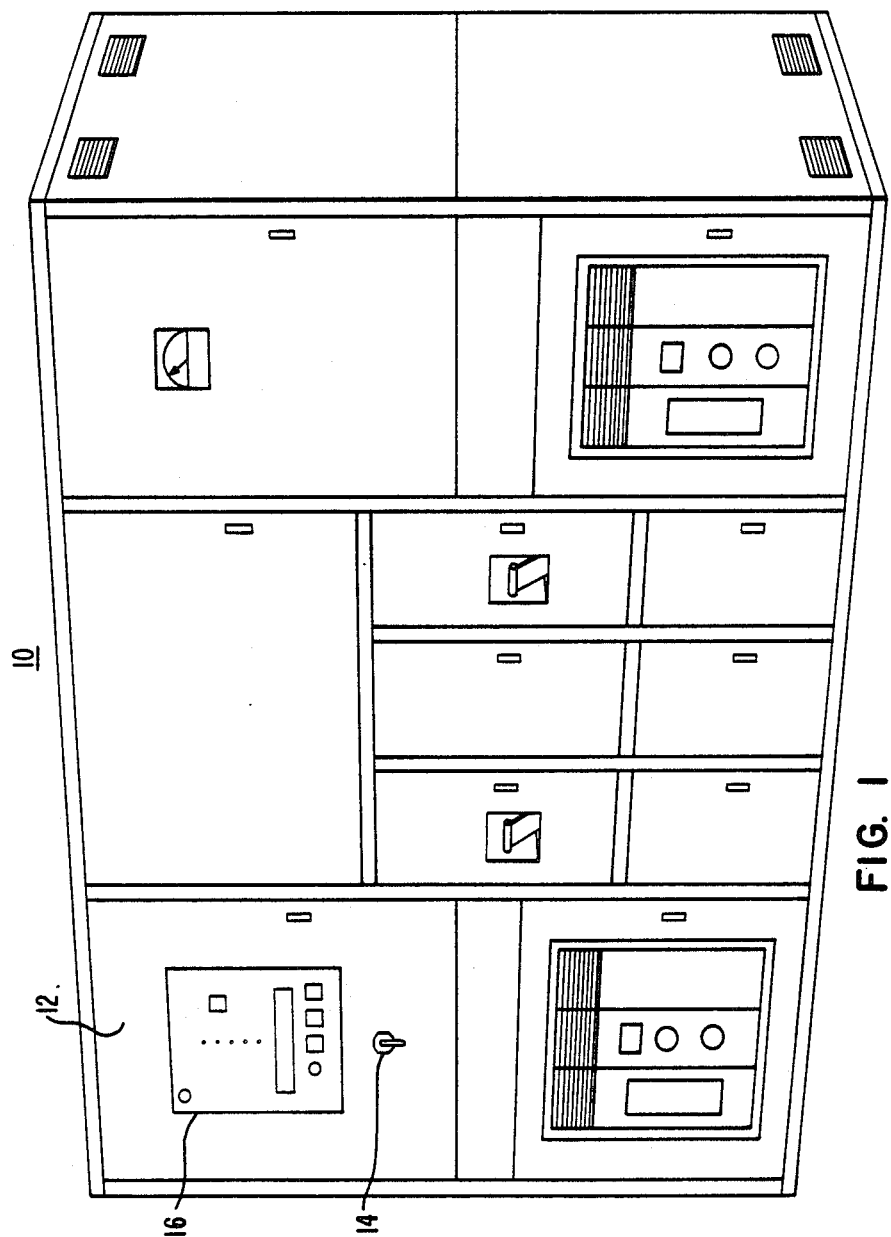
FIG. 1 shows a switchboard or switchgear cabinet with an automatic transfer switch and its controller disposed therein.

Referring now to the drawings and FIG. 1 in particular, a switch gear cabinet 10 is shown. Switchgear cabinet 10 has a transfer switch controller 12 which includes as part thereof a mechanical mode selector switch 14 and a controller front panel 16.

Figure 2:
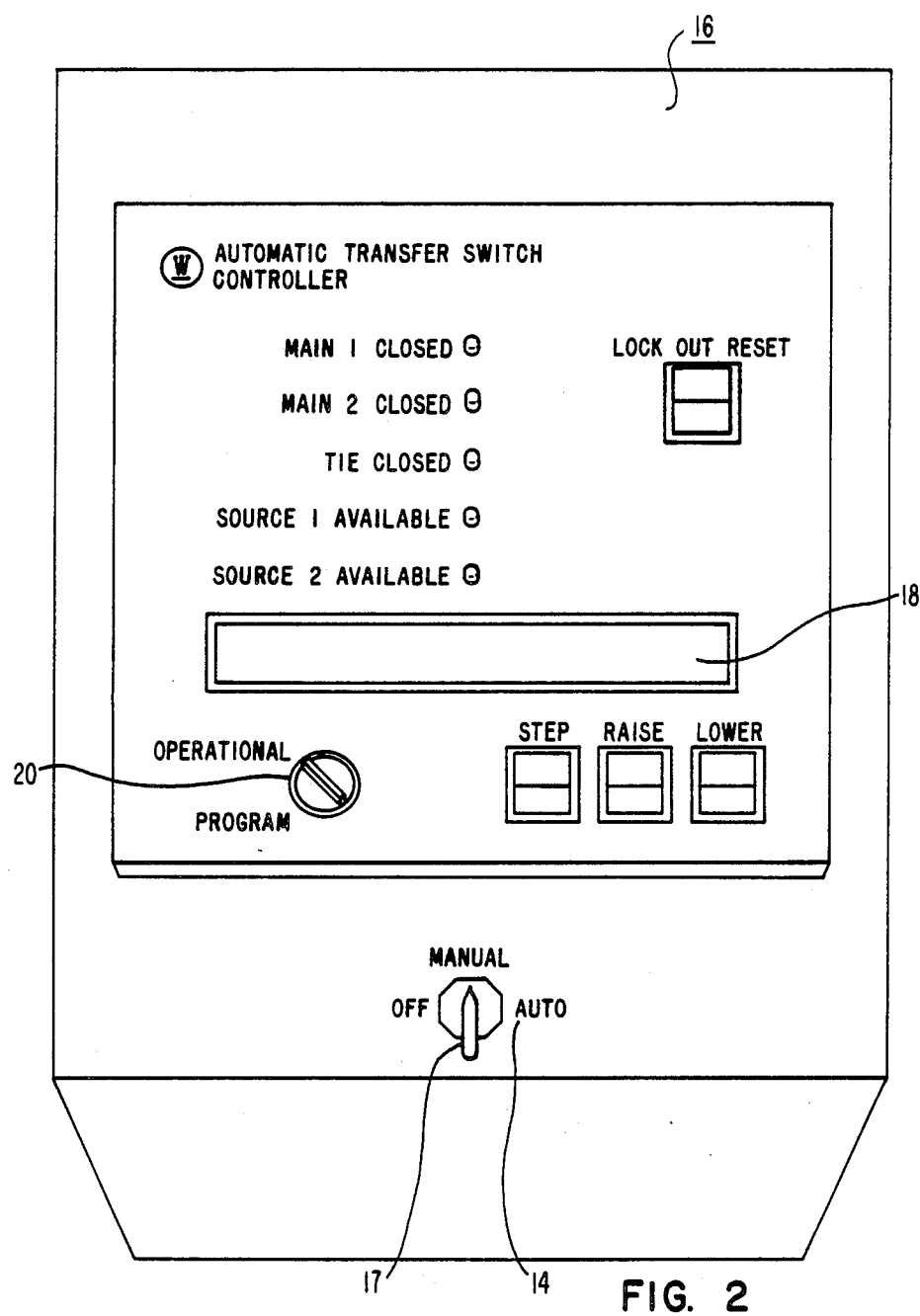
FIG. 2 shows a detailed view of the controller front panel for the controller of FIG. 1.

Referring now more particularly to FIG. 2 that portion of the transfer switch controller 12 of FIG. 1 in the region of the mode selector switch 14 and the controller front panel 16 is shown in greater detail. The mode selector switch 14 may include a control switch handle 17 which can be moved to anyone of three positions: OFF, MANUAL or AUTO, the use of which will be described hereinafter. The controller front panel 16 may include a 16-character controller read out display 18 which may include readout devices which cooperate to display messages and other information. There is also a key switch 20 which is utilized for placing the controller 12 in either the OPERATIONAL mode or PROGRAM mode. There is provided a STEP switch which is utilized to change the input information for the front panel display 18. A number of settable circuit parameters may be changed as a result of manipulation of the switches entitled RAISE and LOWER. In addition, there are five light emitting diodes which may report the status of circuit breakers and power sources controlled and utilized by the transfer switch. Green light emitting diodes entitled SOURCE 1 AVAILABLE and SOURCE 2 AVAILABLE indicate the availability status of either of two separate sources of electrical power. Red light emitting diodes entitled MAIN 1, TIE and MAIN 2 indicate the status of appropriate circuit breakers (illumination means closed) the interconnection scheme of which will be shown and described hereinafter. In the upper right portion of the front panel 16 is a LOCK OUT RESET switch, the use of which will be described in more detail hereinafter.

Figure 3:
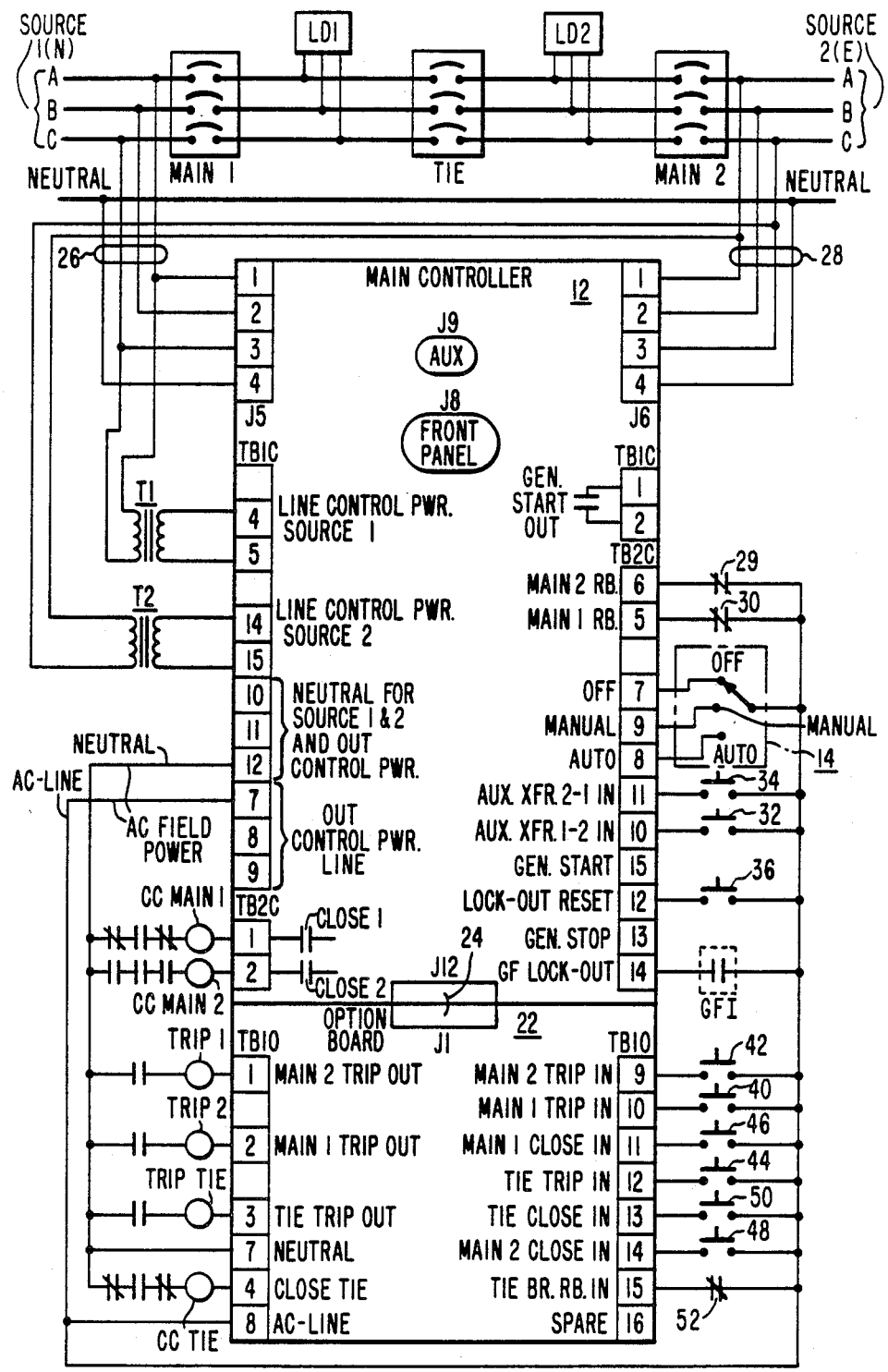
FIG. 3 shows a schematic representation of an automatic transfer switch controller system partially in block diagram form for utilization with an electrically tripped circuit breaker system.
Figure 5G:
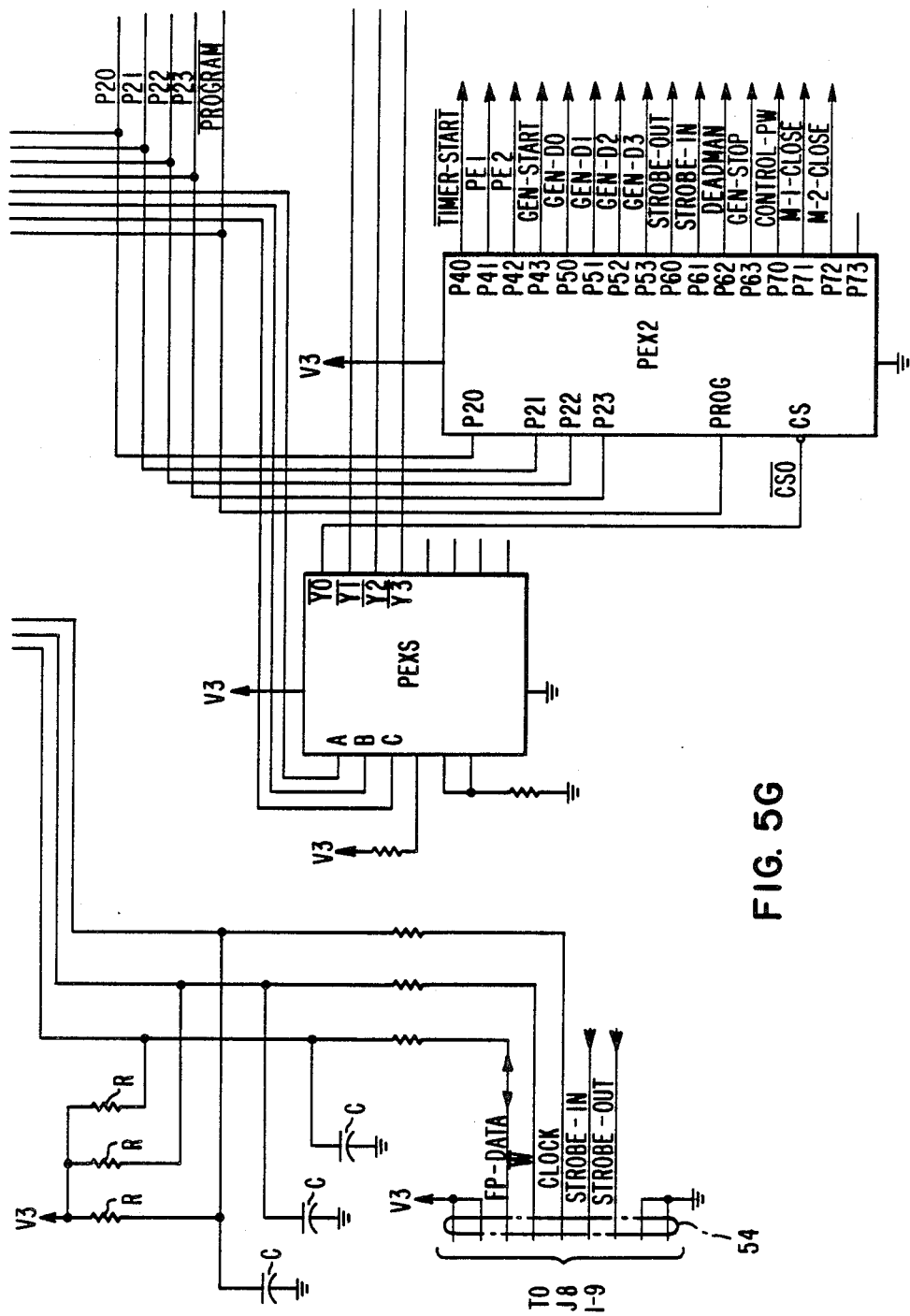
Figure 6A:
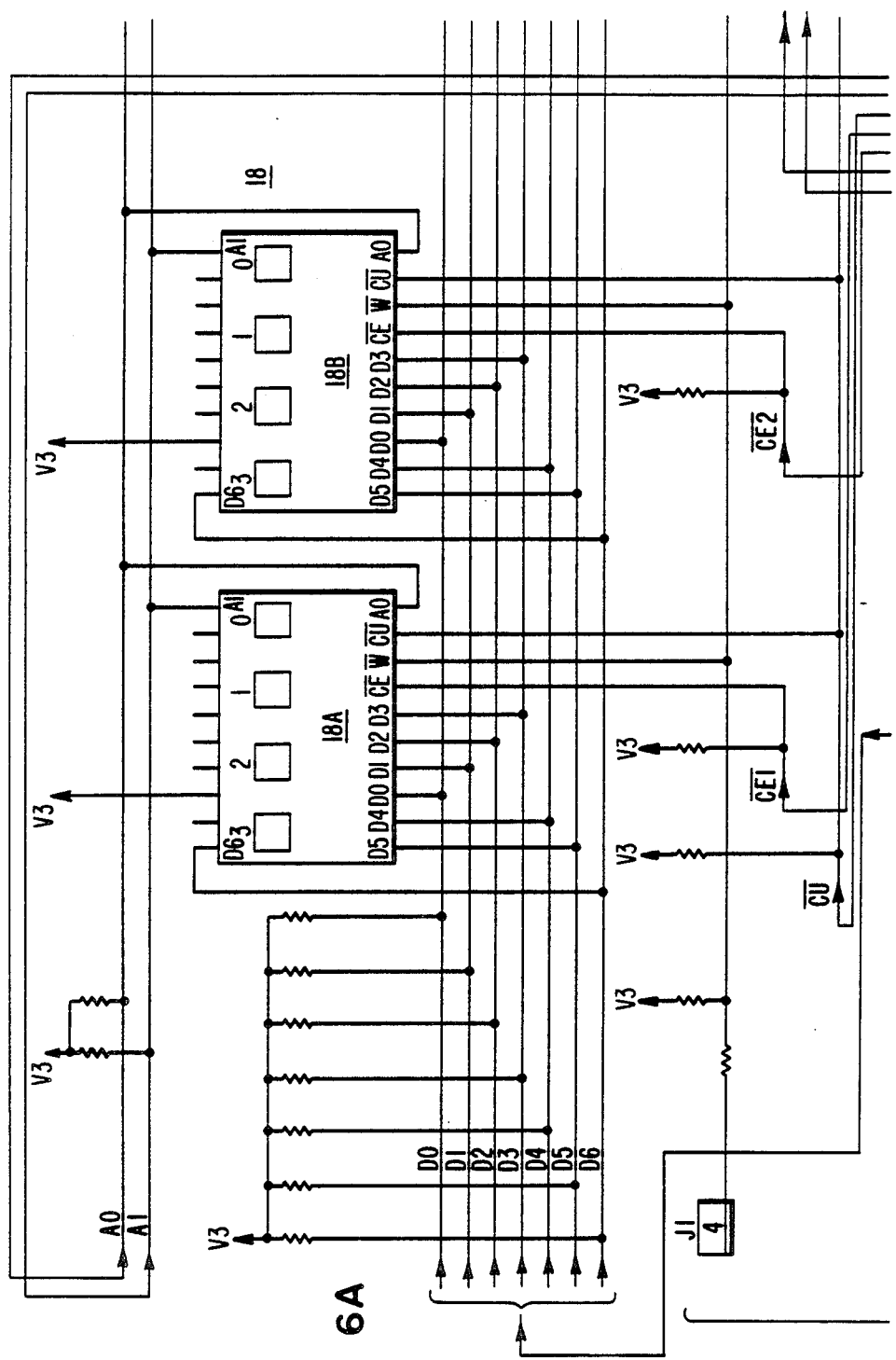
FIGS. 6A through 6D show a schematic representation of the front panel of the controller of FIG. 3 and FIG. 4.
Figure 6B:
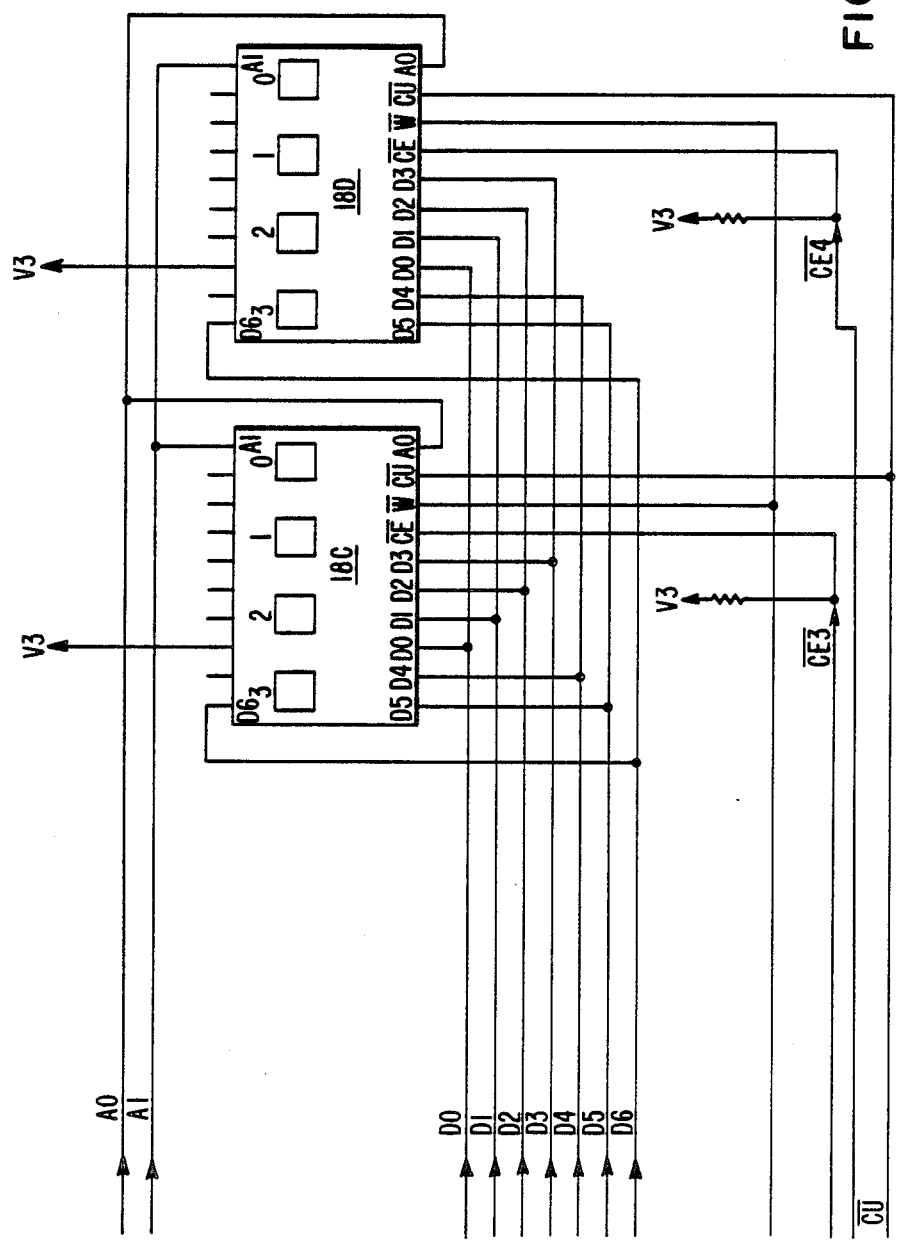
Figure 6C:
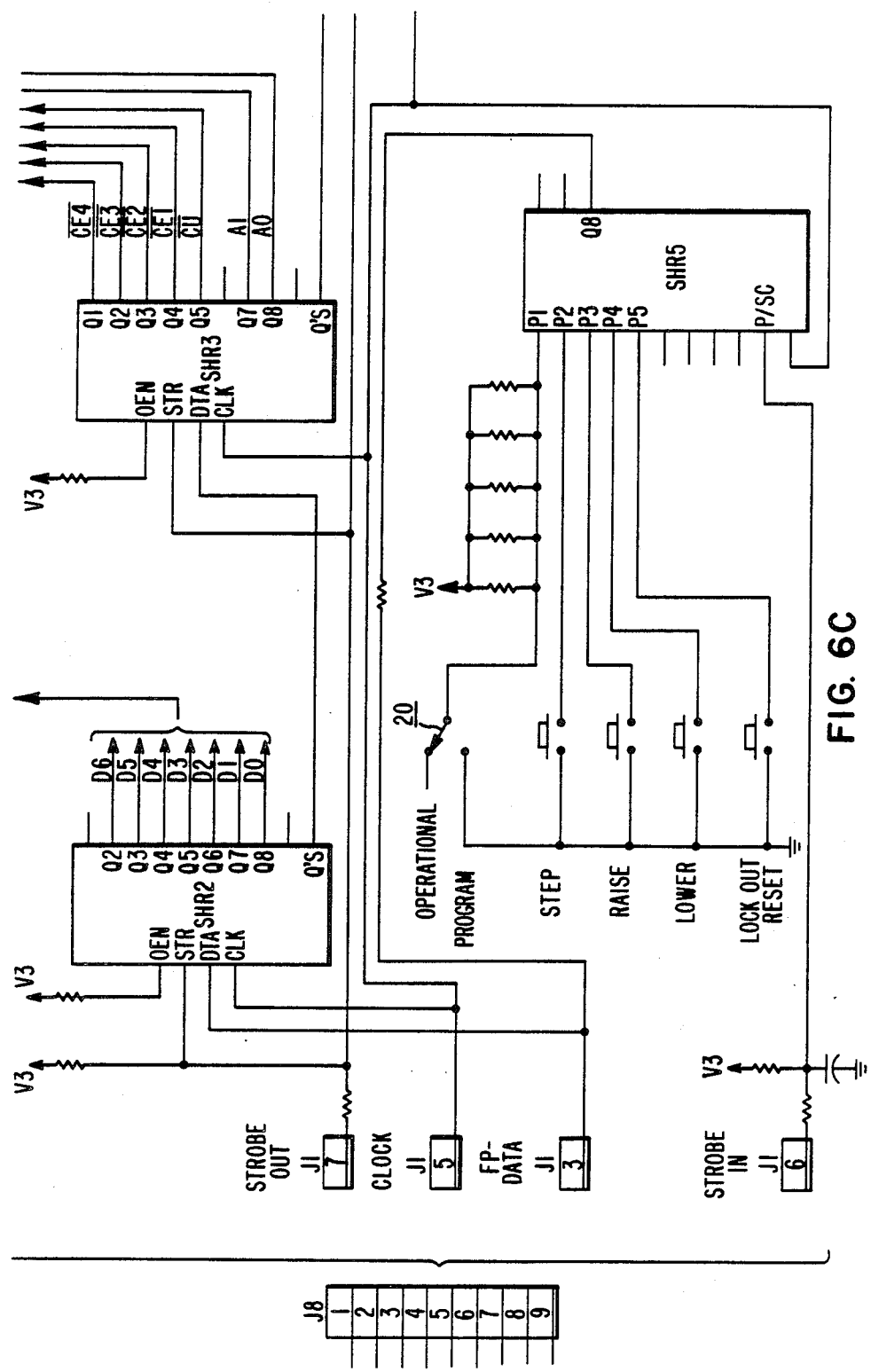
Figure 6D:
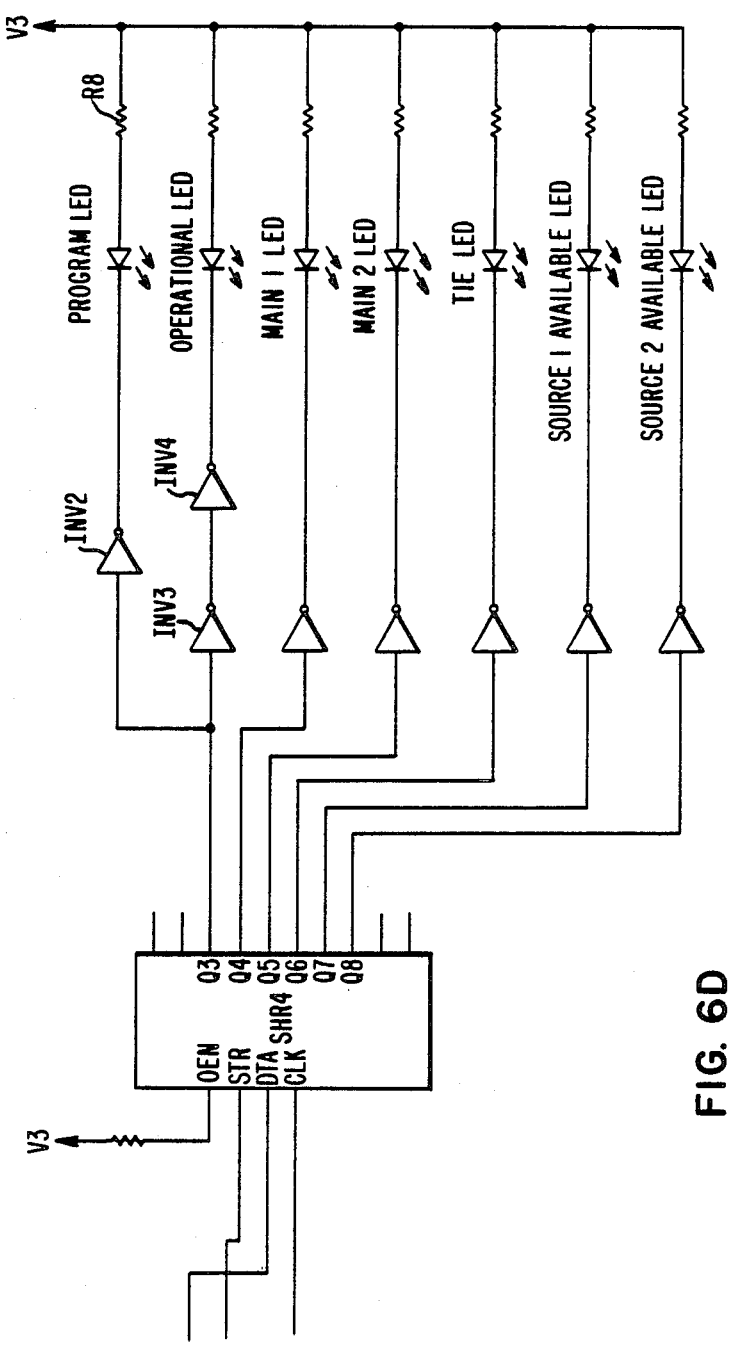

Referring now to FIG. 3 a schematic block diagram of the controller 12 is shown with interconnection to various circuit control devices and to sources of power and associated circuit breakers as described previously. In the preferred embodiment of the invention the source of electrical power SOURCE 1 (sometimes called the normal source N) having three phase lines A, B and C is shown on the left. On the right is shown a second source of electrical power SOURCE 2 (sometimes called the emergency source E) having three corresponding phase lines A, B and C. To the right of SOURCE 1 is a circuit breaker entitled MAIN 1 and to the left of SOURCE 2 is a circuit breaker entitled MAIN 2. In the embodiment of the invention of FIG. 3 a load LD1 is connected to the right of the circuit breaker MAIN 1 and a load LD2 is connected to the left of the circuit breaker MAIN 2. Intermediate the loads LD1 and LD2 is a TIE breaker. In this embodiment of the invention there is provided an OPTION BOARD 22 which is interconnected electrically with the main controller 12 by way of the connectors J1 on the option board and J12 on controller 12 and the interposed eight lead cable 24. Also provided on the main controller 12 are connectors J5 and J6 each of which have four associated input terminals for interconnection with cables 26 and 28 for monitoring the phase voltage status of the sources SOURCE 1 and SOURCE 2. There is also provided on the controller 12 a connector J8 which is utilized for interconnecting the controller 12 with the front panel 16. An auxiliary connector J9 designated AUX may also be present. Disposed on the controller 12 is a terminal board TB1C having terminals 1 through 15 and a terminal board TB2C having terminals 1 through 15. Likewise, on the option board 22 there is a terminal board TB1O having terminals 1 through 16. The interconnection of the terminal board TB1C, TB2C and TB1O with external electrical devices will be described in more detail hereinafter. In the embodiment of the invention shown here the main controller 12 operates in conjunction with the option board 22 and if desired controls the three circuit breakers MAIN 1, MAIN 2 and TIE. In this embodiment of the invention SOURCE 1 and SOURCE 2 are presumed in an unlimiting way to represent electrical utilities. However, in an alternate embodiment of the invention, SOURCE 2, for example, may be a stand-by local electrical generator (see FIG. 4) which is actuated into operation by the main controller 12. LOAD 1 and LOAD 2 may be energized exclusively from SOURCE 1 by closing circuit breaker MAIN 1 and circuit breaker TIE and opening circuit breaker MAIN 2. Alternately, LOAD 1 and LOAD 2 may be energized exclusively from SOURCE 2 by closing circuit breakers MAIN 2 and TIE and opening circuit breaker MAIN 1. Also, circuit breaker MAIN 1 may be closed energizing LD1 exclusively from SOURCE 1 and circuit breaker MAIN 2 may be closed energizing LD2 exclusively from SOURCE 2. In the latter situation, the circuit breaker TIE remains open. In still another arrangement all of the circuit breakers MAIN 1, MAIN 2 and TIE may be closed. The LOADS LD1 and LD2 are then energized concurrently from both SOURCE 1 and SOURCE 2. For purposes of simplicity of illustration presume that SOURCE 1 is the main supply of power for LD1 and LD2. In this case the circuit breaker MAIN 1 will be closed and the circuit breaker TIE will be closed and the circuit breaker MAIN 2 will be open to be closed at a later time in the event that it is necessary to transfer the derivative of power from SOURCE 1 to SOURCE 2. SOURCE 2 in this embodiment of the invention is presumed to be a stand-by source of electrical power. The electrical energy for the main controller 12 and the option board 22 may be derived from SOURCE 1 or SOURCE 2. Electrical power, for example, from the A and C phase lines of SOURCE 1 may be provided by way of a transformer T1 to the input terminals 4 and 5 of the terminal board TB1C. Likewise, power from phase lines A and C of SOURCE 2 may be supplied by way of transformer T2 to the input terminals 14 and 15 of terminal board TB1C. Terminals 4 and 5 of terminal board TB1C are designated LINE CONTROL POWER SOURCE 1 and terminals 14 and 15 are designated LINE CONTROL POWER SOURCE 2. This power is internally handled by the main controller 12 in a manner to be described hereinafter. Externally, a portion of this power is supplied by way of terminals 7 and 12 of terminal board TB1C as the AC-LINE and NEUTRAL AC field power for the various external elements interconnected with main controller 12 or the option board 22. In one embodiment of the invention the electrical power derived from SOURCE 1 and SOURCE 2 as well as the field power is 120 volt alternating current. Terminal 6 on terminal board TB2C is entitled MAIN 2 REPORT BACK and terminal 5 thereof is entitled MAIN 1 REPORT BACK. Both of these are externally fed from auxiliary contacts 28 and 30 on the circuit breakers MAIN 2 and MAIN 1, respectively. Auxiliary contacts 28 and 30 control power from the AC-LINE field wiring lead. When the circuit breaker MAIN 2 is closed, normally open contact 28 is closed, this puts AC voltage on terminal 6 of terminal board TB2C. When the circuit breaker MAIN 1 is closed, auxiliary contact 30 is closed, providing AC voltage on terminal 5 of terminal board TB2C. If contacts 28 and 30 are open circuit breakers MAIN 1 and MAIN 2 are open. If contacts 28 and 30 closed, circuit breakers MAIN 1 and MAIN 2 are closed. It is possible to have circuit breakers MAIN 1 and MAIN 2 both opened, both closed or in different states. Terminals 7, 8 and 9 of terminal board TB2C are externally connected to the OFF, AUTO, and MANUAL output terminals of the mode selector switch 14 as described previously with respect to FIG. 2. Correspondingly, the input terminals 7, 8 and 9 of terminal board TB2C are identified as OFF, AUTO and MANUAL, respectively. When the switch 14 is in the OFF state, controller 12 does not operate to control the circuit breakers MAIN 1, MAIN 2 or TIE. If on the other hand, the switch 14 is in the MANUAL state, then the control 12 may be manually manipulated to place the circuit breakers MAIN 1, MAIN 2 and TIE in various state of conduction or non-conduction. Finally, if the switch 14 is in the AUTO mode, then controller 12 will operate to automatically cause the circuit breakers MAIN 1, MAIN 2 and TIE to open or close in appropriate circumstances in accordance with a predetermined set of conditions which are programmed into the controller 12 in a manner to be described hereinafter. Input terminals 10 and 11 of terminal board TB2C are entitled AUXILIARY TRANSFER 1-2 and AUXILIARY TRANSFER 2-1, respectively. These terminals are connected to pushbutton switches 32 and 34, respectively, the other ends of which are connected to the AC-LINE lead. When the switch 14 is in the MANUAL mode, then actuation of pushbutton 32 will cause a transfer of power from SOURCE 1 to SOURCE 2 by appropriate operation of circuit breakers MAIN 1, MAIN 2 and/or TIE. On the other hand, if the operator depresses pushbutton 34 the controller will cause transfer of power from SOURCE 2 to SOURCE 1 by corresponding operation of the circuit breakers MAIN 1, MAIN 2 and/or TIE. Terminal 14 of terminal board TB2C is designated GF LOCK-OUT and it is connected to a contact device designated GFI which may be part of a separate ground fault sensing system. The contact GFI is powered by the AC-LINE lead. Terminal 12 of terminal board TB2C is connected by way of a pushbutton 36 to the AC-LINE lead. Terminal 12 is designated as LOCK-OUT RESET. In the event that a ground fault lock-out has occurred by actuation of the GFI relay the controller 12 will prevent closure of all circuit breakers MAIN 1, MAIN 2 and TIE. In order to return to normal operation, pushbutton 36 is actuated which in turn will reset the circuit breakers MAIN 1, MAIN 2 and/or TIE if they tripped regardless of what status the mode selector switch 14 is in and provided that the ground fault has cleared. Terminals 13 and 15 of terminal board TB2C are designated GENERATOR STOP and GENERATOR START, respectively. As is best described with respect to the embodiment of FIG. 4 to be described hereinafter they internally cooperate with output terminals 1 and 2 of terminal board TB1C which are collectively designated GENERATOR OUTPUT START. An auxiliary generator starting system may be externally interconnected with the terminals 1 and 2 of terminal board TB1C for starting the auxiliary generator at an appropriate time for supplying power to the system. For example, SOURCE 2 may be the auxiliary generator. The actuation of the generator will take place regardless of whether the mode selector switch 14 is in the MANUAL or AUTO mode. Terminals 10, 11 and 12 of terminal board TB1C represents the common NEUTRAL for SOURCE 1, SOURCE 2 and the output control or field power lead AC-LINE. Terminals 8 and 9 of terminal board TB1C cooperate with terminal 7 thereof to provide the aforementioned output field power. The closing coils for the circuit breaker MAIN 1 and MAIN 2 are interconnected externally to the input terminals 1 and 2 of the terminal boards TB2C. These outputs are designated respectively CLOSE 1 and CLOSE 2. Energization of terminals 1 and 2 of terminal board TB2C will actuate the closing coils CC for the circuit breakers MAIN 1 and MAIN 2 and close those circuit breakers. In a like manner, terminal 4 for terminal board TB1O of option board 22 is interconnected with the closing coil of the TIE breaker. External energization of terminal 4 of terminal board TB1O will cause the TIE circuit breaker to close. Terminals 1, 2 and 3 respectively of terminal board TB1O of the option board 22 are output terminals which are interconnected respectively with the trip coils TRIP 1, TRIP 2 and TRIP TIE of the circuit breakers MAIN 1, MAIN 2 and TIE, respectively so that energization of any of those terminals will cause the associated circuit breaker to trip or open. The neutral for the option board 22 is supplied by way of terminal 7 of terminal board TB1O. Terminals 10, 9 and 12 of terminal board TB1O of option board 22 are designated MAIN 1 TRIP, MAIN 2 TRIP and TIE TRIP, respectively. Each of these terminals is an input terminal which is interconnected with a pushbutton 40, 42 and 44, respectively for external manual control of the tripping of the circuit breakers MAIN 1, MAIN 2 or TIE, respectively by way of terminals 1, 2 and 3 of TB1Q. In a like manner, terminals 11, 14 and 13 of the terminal board TB1O represent the CLOSE inputs for the circuit breakers MAIN 1, MAIN 2 and TIE, respectively. These terminals are externally connected to pushbuttons 46, 48 and 50, respectively for manual closing of the circuit breakers MAIN 1, MAIN 2 and TIE, respectively by way of terminals 1, 2 and 4 respectively of TB1Q. Terminal 15 of terminal board TB1O is the TIE BREAKER REPORT BACK input terminal which is connected to a normally open auxiliary contact 52 on the TIE breaker. As will be described later hereinafter the front panel terminal board J8 is interconnected with the front panel 16 by way of a lead 54 as is best shown in FIGS. 5G and 6B.

Figure 4:
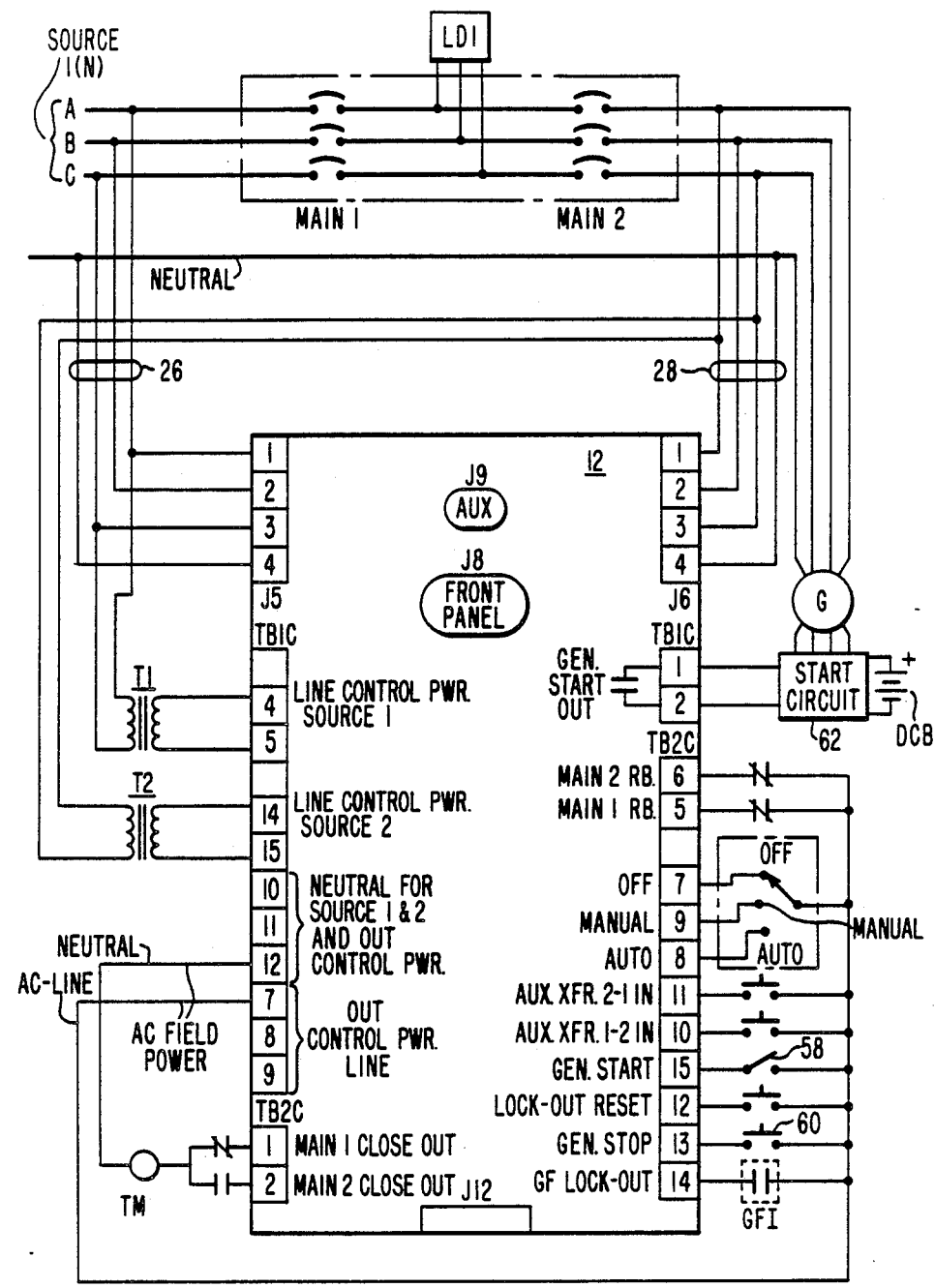
FIG. 4 shows an embodiment similar to that of FIG. 3 for a simplified system.

Referring now to FIG. 4 a schematic block diagram of another embodiment of the invention is shown. In this case no option board is utilized. All of the elements shown in FIG. 4 are identical to those with similar reference symbols in FIG. 3. In this case SOURCE 2 may be considered to be an auxiliary generator G.

There may be provided a transfer motor TM which is interconnected by way of relay contacts with terminals 1 and 2 on terminal board TB2C. Furthermore there is interconnected with the terminals 1 and 2 of terminal board TB1C a starting circuit 62 for the generator G. This will be described hereinafter with respect to the embodiment of FIG. 4. Also, interconnected with terminal 15 of terminal board TB2C is a start pushbutton 58 for the generator start circuit 52. There is connected with terminal 13 of terminal board TB2C a stop pushbutton 60. Manual actuation of the start pushbutton 58 will cause the internally connected GENERATOR START OUTPUT contact to close, thus energizing the start circuit 62 of the generator G thus bringing that generator G into a disposition of providing electrical power at phase lines A, B and C on the right of FIG. 4. On the other hand, actuation of the pushbutton 60 will stop the generator G in a similar manner. The generator G may be started either manually as previously described or automatically in a manner to be described hereinafter. Generator G may also be periodically exercised by the system. In a like manner, once the generator G has been placed in a disposition of providing electrical power at SOURCE 2 the transfer motor TM may be actuated to open MAIN 1 and close MAIN 2 so that the load LD1 may be empowered from the generator G. Subsequent energization of terminals 1 and 2 of terminal board TB2C in a manner to be described hereinafter may cause the transfer motor TM to cause circuit breaker MAIN 2 to open and cause circuit breaker MAIN 1 to close thus reenergizing load LD1 from SOURCE 1. The transfer motor arrangement may also be used with the embodiment of FIG. 3 in place of the closing coils MAIN 1 and MAIN 2. Correspondingly the closing coils may be used instead of the transfer motor for the embodiment of FIG. 4.

Figure 5A:
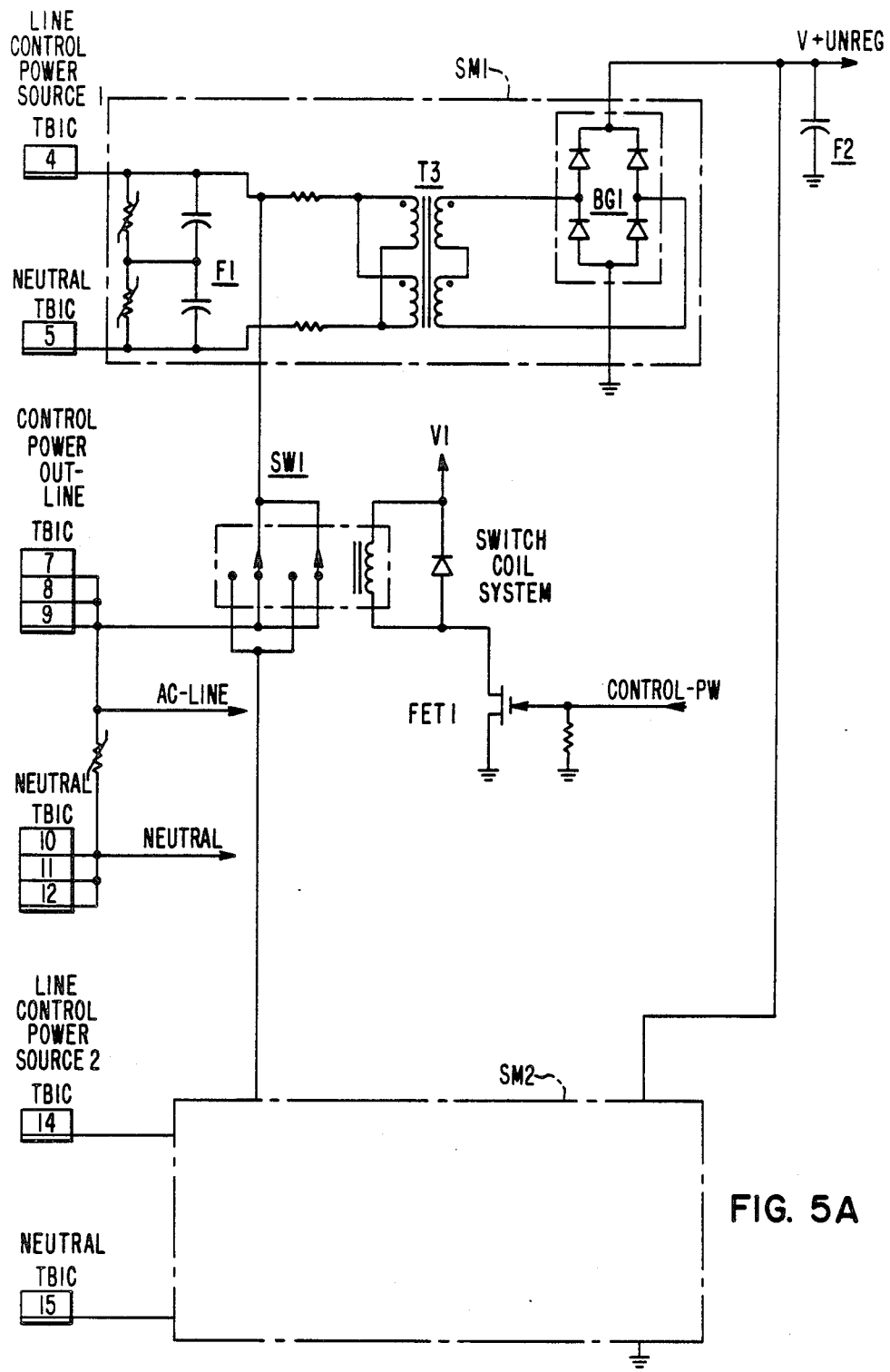
Figure 5B:
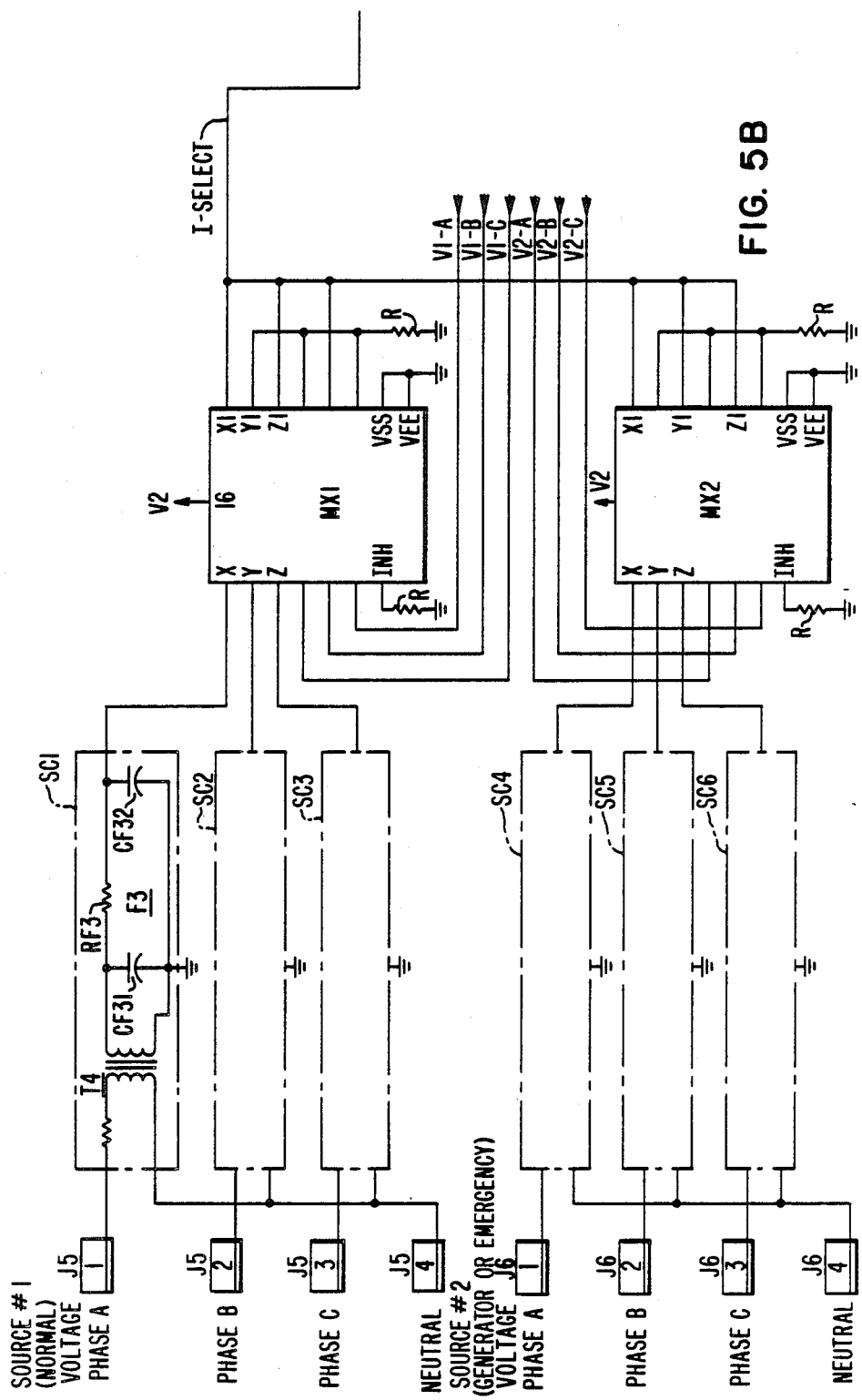

Referring now to FIGS. 3 and 5A there is shown the power supply auctioneering circuit associated with terminals 4, 5, 7 through 12, 14 and 15 of terminal board TB1C. Single phase 120 volt alternating current may be supplied to terminals 4 and 5 by way of transformer T1. From there it is passed through a filter F1 to one pole of a switch SW1. In a like manner single phase 120 volt AC power is provided to terminals TB1C 14 and 15 from SOURCE 2. This power is provided by way of another line to another pole on the switch SW1. The switch SW1 is controlled by a field effect transistor FET1 and a control signal designated CONTROL-PW. This latter signal is provided by another portion of the controller in a manner to be described hereinafter. Depending upon the status of the signal CONTROL-PW, the single phase voltage from SOURCE 1 or SOURCE 2 will be auctioneered to be provided to the terminals 7, 8 and 9 on terminal board TB1C for the line voltage AC-LINE. There also being provided NEUTRAL at terminals 10, 11 and 12 of terminal board TB1C. The 120 volt AC signal is additionally supplied to a transformer T3 and from thence to a full wave bridge rectifier BG1. The output voltage V+UNREG of the full wave bridge rectifier BG1 is provided to a filter capacitor F2. The circuit which includes the filter F1, the transformer T3 and the bridge rectifier BG1 is identified as source module SM1. A similar source module SM2 provides power to the output of the common filter F2 so that the voltage V+UNREG may come from either SM1 or SM2 depending upon which of one of either or both sources are utilized at the time. The input circuit for the controller 12 associated with terminals 1 through 4 of connector J5 and terminals 1 through 4 of connector J6 is also described. Each of the phase lines A, B and C and the neutral for SOURCE 1 is supplied respectively to terminals 1 through 4 of connector J5 and each of the phase voltages A, B and C and the neutral for SOURCE 2 is supplied to respectively terminals 1 through 4 of connector J6. Each of the aforementioned phase voltage terminals is internally connected to separate signal conditioning modules SC1 through SC6 respectively. The neutrals are interconnected to the neutral of each module. All of the signal conditioning modules SC1 through SC6 may in one embodiment of the invention be the same. In each case, the voltage is supplied to a resistor and transformer T4 and thence to a filter network F3 comprising two capacitors and one resistor connected in $\pi$ configuration. The transformer T4 in cooperation with the resistor act to convert the phase voltage to a relatively low level corresponding current. Each of the current signals from the signal conditioning modules SC1, SC2 and SC3 is provided concurrently to the X, Y and Z inputs of an analog multiplexer MX1. Multiplexer MX1 is empowered on terminal 16 thereof by the voltage V2 which in one embodiment of the invention may be a highly filtered 5 volt signal. The INH input terminal of the multiplexer MX1 is grounded through a resistive element for testing purposes and the VSS and VEE input terminals of the multiplexer MX1 are grounded. The X1, Y1 and Z1 output terminals of the multiplexer MX1 are connected together and to the output of a similar multiplexer MX2 to selectively form the signal I-SELECT. Multiplexer MX2 may be the same as multiplexer MX1 except that the currents supplied thereto are derived from SOURCE 2 (via signal conditioning module SC4, SC5 and SC6) rather than SOURCE 1. The I-SELECT signal then may be any one of six currents representing any one of six phase voltages. The I-SELECT output signal may be a square wave voltage signal varying in amplitude between 0 and positive 5 volts DC.

Figure 5C:
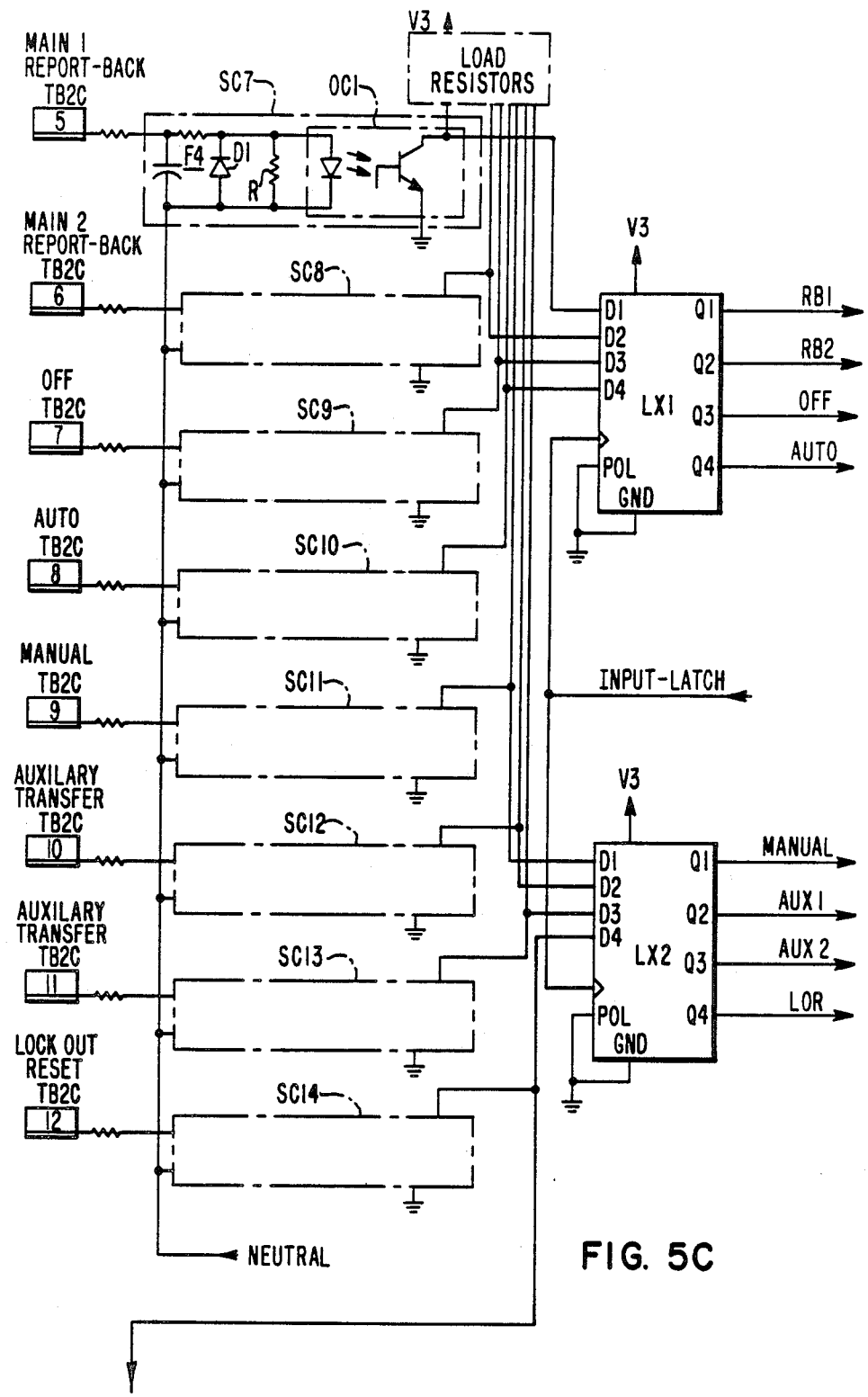
Figure 5D:
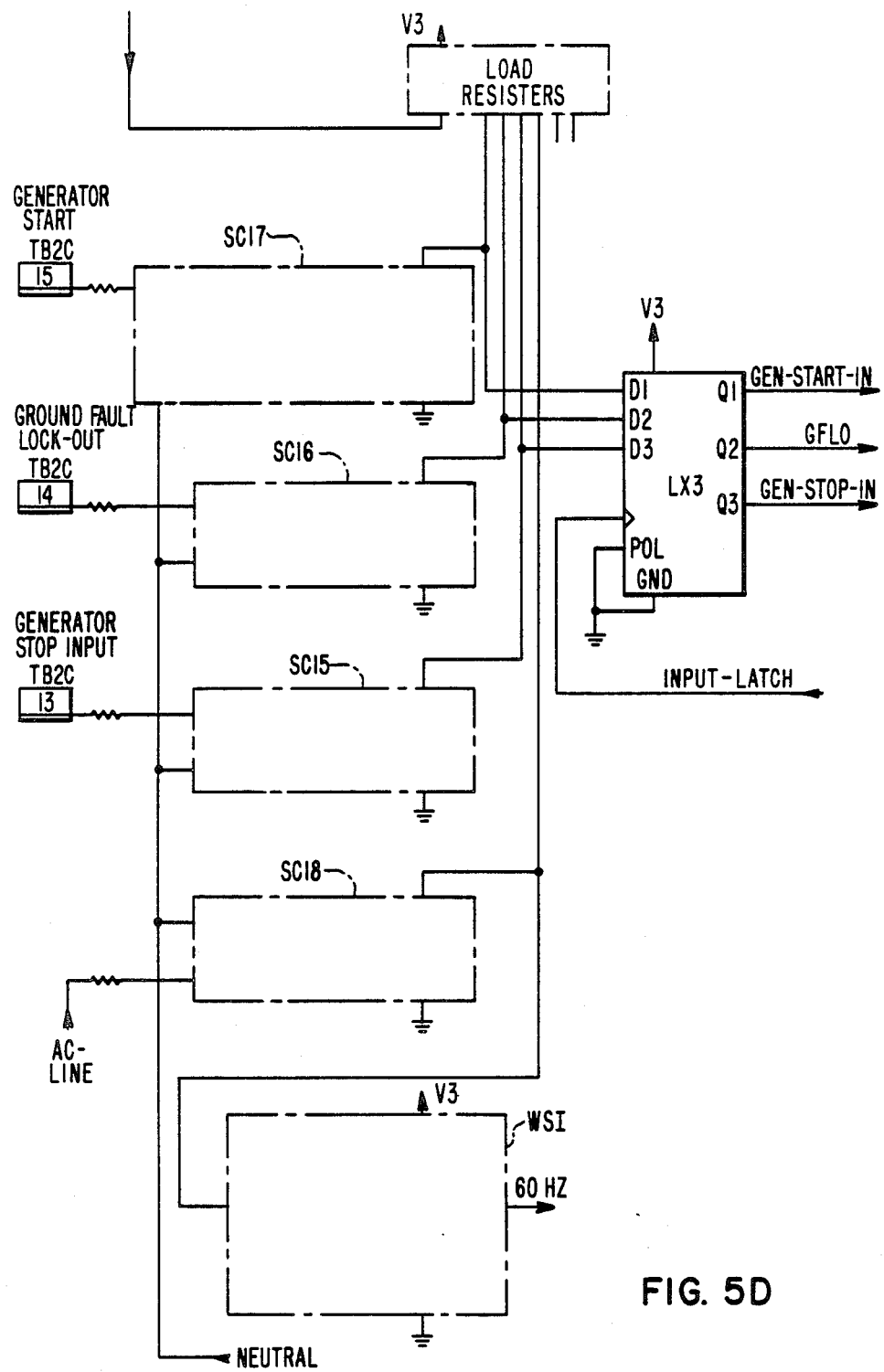

Again referring to FIGS. 3, 5C and 5D the inputs for the terminals 5 through 15 of terminal board TB2C and their interrelation with the remainder of the main controller 12 is described. There is provided a signal conditioning circuit SC7 which is interconnected with terminal 5 of terminal board TB2C and the NEUTRAL terminal previously discussed with respect to terminals 10, 11 and 12 on terminal board TB1C. The 120 volt AC signal provided between the higher voltage terminal on terminal board TB2C and NEUTRAL is supplied to a filter network F4 comprising a resistor and capacitor. Across this network is connected a diode D1 which removes the bottom half cycles of the 120 volt AC signals in a conventional manner. This in turn is supplied to an opto-coupler OC1 which comprises a light emitting diode optically coupled to a transistor. The collector of the transistor is connected to a voltage source V3 through a resistive element RR across which a voltage is developed as a function of the conduction status of the opto-coupler OC1. The output of the transistor is a five volt square wave signal which varies between 0 and 5 volts DC. It is supplied to the D1 input terminal of a latch module LX1. This signal is transferred across the latch module LX1 to the Q1 output thereof whereupon it is identified as signal RB1 which may also correspondingly vary in amplitude between 0 to 5 volts positive DC. A control signal designated INPUT-LATCH is supplied to the control input terminal of the latch module LX1. When this 5 volt signal goes high any signal that is present on the input terminal thereof is correspondingly frozen on the related output terminal thereof regardless of how the status of the voltage on input terminal thereafter changes until the INPUT-LATCH signal goes low again. Terminals 6 through 15 of terminal board TB2C feed similar signal conditioners SC8 through SC17. The outputs of signal conditioners SC8 through SC10 are connected to inputs D2 through D4, respectively, of latch module LX1. The corresponding outputs of the latch module LX1 are Q2 through Q4 and are designated as the RB2, OFF and AUTO signals, respectively. In a like manner the output of the signal conditioners SC11 through SC14 are connected to the D1 through D4 input terminals of a similar latch module LX2. These correspond to outputs Q1 through Q4 thereof and are designated the MANUAL, AUX1, AUX2 and LOR signals, respectively. The output of signal conditioner SC15 is connected to the D3 terminal of latch LX3, the output of signal conditioner SC16 is connected to the D2 terminal thereof and the output of latch SC17 is connected to the D1 input terminal thereof. The Q1 through Q3 outputs are designated GEN-START-IN, GFLO, and GEN-STOP-IN, respectively. The output of the signal conditioner SC18, the input of which is designated AC LINE is connected to a conventional wave shaper and inverter WSI which provides a square wave representative output signal called 60 HZ which may vary between 0 and 5 volts DC over a period of 16.67 milliseconds with a 50 percent duty cycle. The wave shaper and inverter WSI and the latches LX1-LX3 are powered by the V3 input signal.

The signal I-SELECT is an electrical current waveform which comes from the outputs of the multiplexers MX1 or MX2. The current waveform is representative of the voltage waveform on the various input terminals designated J5 1 through 3 and and J6 1 through 3. This current waveform is supplied to an operational amplifier inverter and gain control module OA1 and parallel connected resistive element R2 and capacitive element C2. The elements R2, C2 are connected in parallel across the input to output terminals of the inverter. The output of the operational amplifier OA1 is a voltage signal which is proportional to I-SELECT. It is provided to the combination of series connected resistive elements R3 and R4 where resistive element R4 is variable. The combination of the resistive elements R3 and R4 convert the voltage to a current which is supplied to the A input terminal of a semi-custom integrated circuit SCIC, the function of which will be described hereinafter. The output of the operational amplifier OA1 is also provided to a square wave generating circuit SWGC of any conventional type which provides a square wave output signal CYCLE the duty cycle of which is proportional to the frequency of the signal I-SELECT. The signal CYCLE varies from 0 to 5 volts positive DC. The semi-custom integrated circuit SCIC has a RANGE 1 signal on the R1 input terminal thereof and a RANGE 2 signal on the R2 input terminal thereof. The production of the RANGE 1 and RANGE 2 input signals will be described hereinafter. The purpose of the RANGE 1 and the RANGE 2 signals is to determine the magnitude of the output signal IOUT from the semi-custom integrated circuit SCIC. The determination of the values RANGE 1 and RANGE 2 are related to an operator manipulation of related display values on the front panel display by adjusting the RAISE and LOWER adjust buttons on the front panel 16 so as to cause appropriate voltage ranging values to be displayed in the readout or display 18. These values are related to what the operator determines is the maximum voltage to be utilized by this circuit. Once a value is chosen the range signals RANGE 1 and/or RANGE 2 operate to set the value of IOUT in a proper range for utilization by the remainder of the control circuit. The current IOUT is on pin 15 of the semi-custom integrated circuit SCIC. The RANGE 1 value is supplied to pin 9 thereof and the RANGE 2 value is supplied to pin 8 thereof. The signal IOUT is a current wave shape. It is a one-half cycle analog representation value of the various voltages detected on connector J5 terminals 1 through 3 or connector J6 terminals 1 through 3. There is also provided to the semi-custom integrated circuit chip SCIC at pin 11 thereof, through a voltage divider network and capacitor a signal called DEADMAN. The DEADMAN signal is produced elsewhere in the control unit 12 in a manner which will be described hereinafter. A microprocessor MP strobes pin 11 with the DEADMAN signal occasionally causing that pin to toggle from high to low or low to high state. The combination of the resistive elements R5, R6 and the capacitive element C3 creates a fairly long time constant. The frequency at which the DEADMAN signal alternates between high and low is sufficient to provide an oscillating input signal to pin 11 of the semi-custom integrated chip SCIC. As long as that oscillating signal is present and in a predetermined frequency range the output signals from the chip SCIC are produced normally. However, if the oscillating DEADMAN signal is not present or not in the proper frequency (i.e. 100 HZ to 100 KHZ range the chip resets, thus providing a high level signal on pin 12 of the semi-custom integrated chip SCIC which produces the RESET signal which will eventually cause the microprocessor MP to be reset. This means that if the microprocessor MP is not sending an alternating square wave signal DEADMAN, the semi-custom integrated chip SCIC infers that there is a problem with the microprocessor MP and therefore resets it. The microprocessor MP then goes to a position in its software program equivalent to where initial power-up had occurred.

The semi-custom integrated chip SCIC also provides an additional function: namely, of driving a power supply PS. Power supply PS is not the subject matter of this invention and which may be of a conventional kind. For purposes of simplicity of illustration, power supply PS is shown as having as an input source of power V+UNREG as described previously. As output the power supply supplies the voltage values V1, V2, V3, V4 and V5. In one embodiment of the invention voltage V1 is +24 volts DC; voltage V2 (also called +5 VF) is +5 volts DC, is a highly filtered 5 volt DC voltage; voltage V3 is +5 V DC; voltage V4 is a highly filtered −15 volt DC voltage (also called −15 VF); voltage V5 is −15 volts DC and Voltage V6 (+5 VCAP) is a special power supply which remains on for about 4 minutes after V+UNREG goes off. This special power supply may be utilized to start an emergency generator according to circuitry described with respect to FIG. 5L and FIG. 4. This emergency power supply EPS may comprise a diode DR1 the cathode of which is connected to the V3 power voltage which was described previously may be +5 volts DC. The emergency power supply EPS may also include a resistive element RP1 which is interconnected with the voltage V1 of the power supply PS as described previously which may be +24 volts DC as described previously. The anode of the diode DR1 is connected to the cathode of a diode DR2 and the anode of a diode DR3. The anode of the diode DR2 is connected to the other side of the resistive element RP1 and to the anode of a diode DR4. The cathode of the diode DR4 is connected to the anode of a diode DR5. The cathode of the DR5 is connected to one side of a resistive element RP2. The other side of the resistive element RP2 is connected to the anode of a diode DR6 and to one side of a high capacity capacitor CP1. The cathode of the diode DR6 is connected to the cathode DR3 and to one end of a filter capacitor arrangement CP2. The other end of the capacitor CP1 and the other end of the capacitor CP2 is connected to system common ground. The cathode of the diode DR6 represents the V6 power supply terminal for the power supply PS. In operation, as long as the voltage signal V+UNREG is present which is indicative of one of the alternate sources of line control power being present then the +24 volt DC power supply (V1) charges the capacitive element CP1 through the resistive element RP1, the diodes DR4 and DR5 and the resistive element RP2. The five volt DC voltage 3C on the cathode of the diode DR1 ensures that the voltage on the anode thereof is approximately 5.5 volts. This means that the voltage on the anode of the diode DR2 is approximately 6 volts which in turn means that the voltage on the anode of the diode DR6 is approximately 5 volts due to the one volt drop across the diodes DR4 and DR5. This provides an upper limit for the voltage across the capacitive element CP1. In a normal operating condition when the V+UNREG voltage is present a current source exists between the 24 volt DC power supply terminal V1 through the resistive element RP1, the diode DR2 and the diode DR3 for the V6 output voltage. However, if either source of line control power is lost then the V+UNREG voltage is lost and the V1 and V3 voltages which supply the emergency power supply EPS is lost. Therefore, the voltage V6 comes from the capacitor CP1 which will supply current at approximately 5 volts for approximately 4 minutes after the voltages V1 and V3 disappear. Capacitive element CP1 may be 0.33 farads in a preferred embodiment of the invention. This rather large capacitance value gives the capacitor CP1 the capability of delivering current for approximately 4 minutes at approximately 5 volts after the voltages V1 and V3 disappear.

Figure 5E:
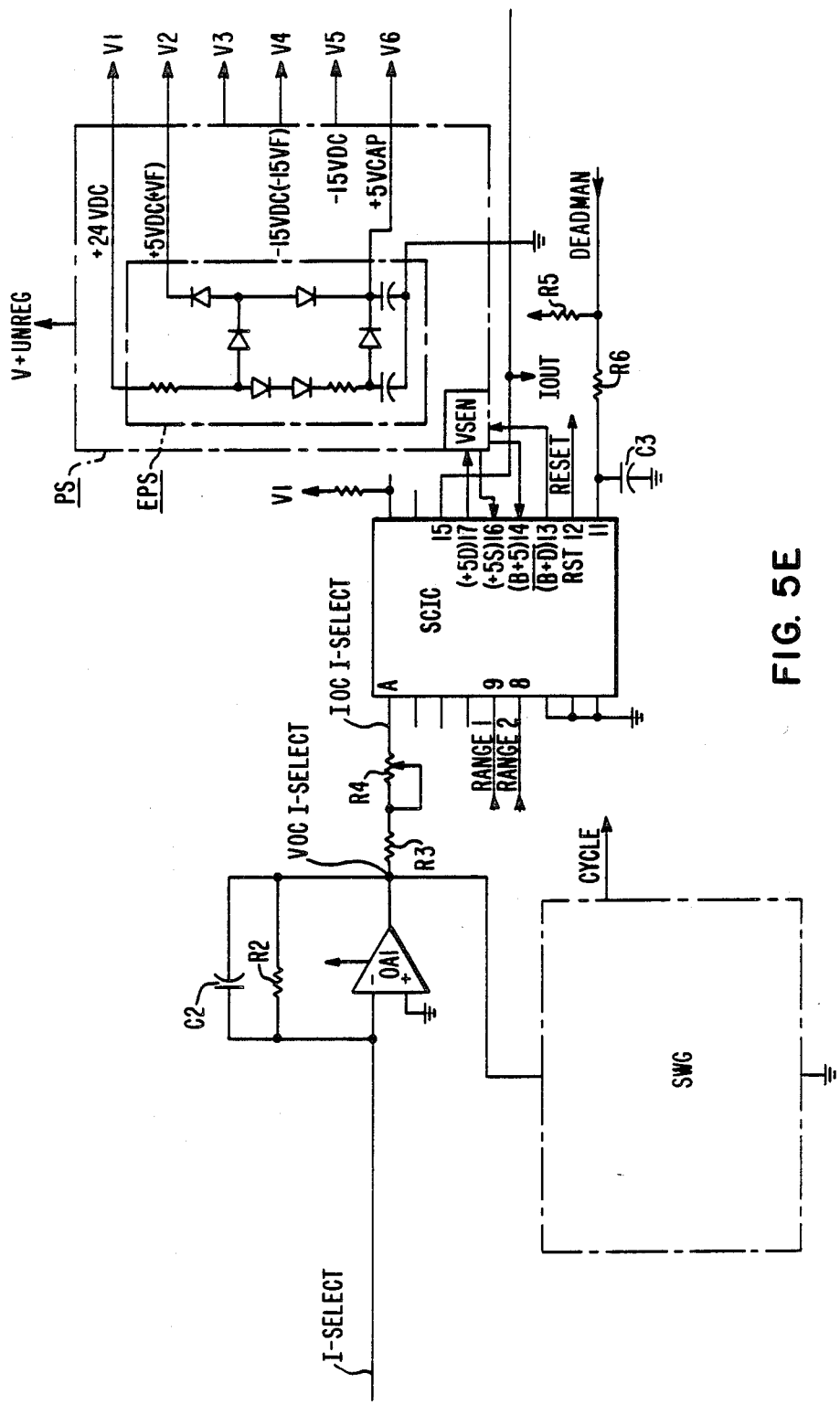
Figure 5F:
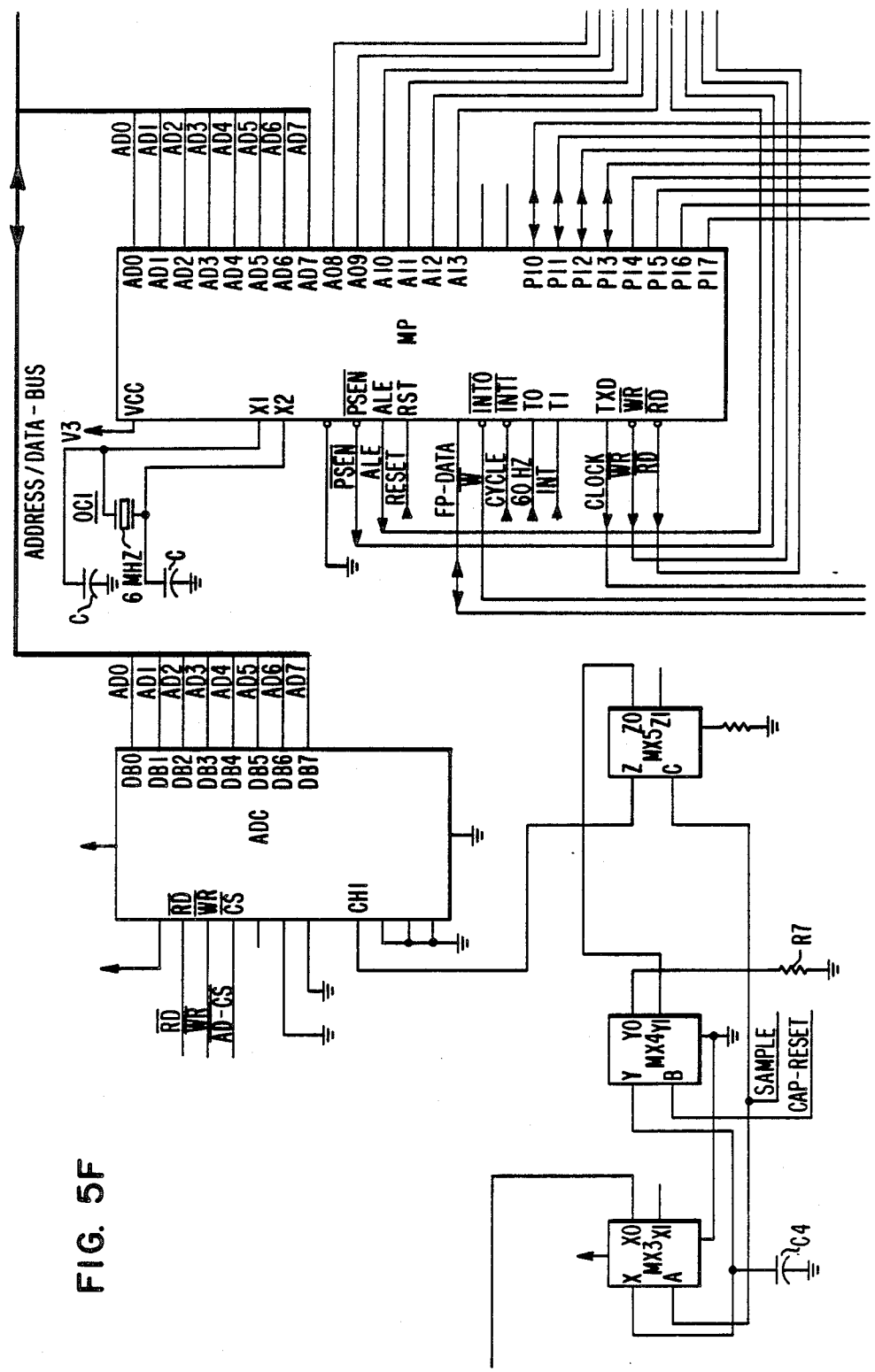

Referring now to FIGS. 5E and 5F the interaction of the IOUT output signal of the semi-custom integrated circuit SCIC with an analog to digital (A to D) converter ADC is described. The IOUT signal is provided to the analog-to-digital converter ADC through three multiplexers, MX3, MX4 and MX5, the states of which are changed in correspondence with the SAMPLE and CAP-RESET digital control signals. Each of the multiplexers MX3, MX4 and MX5 has a common terminal X, Y and Z, respectively, a control terminal A, B and C respectively and two switched terminals X0, X1; Y0, Y1; and Z0, Z1 respectively. A digital 1 on one of the A, B, or C control terminals will cause the common terminal X, Y and Z respectively, to be interconnected with the X1, Y1 and Z1 terminal respectively. A digital 0 on one of the A, B or C control terminals will cause the common terminal X, Y and Z respectively to be interconnected with the X0, Y0, and Z0 terminal, respectively. The A and C control terminals are interconnected with the SAMPLE digital control signal while the B control terminal is interconnected with the CAP-RESET digital control signal. The output signal IOUT of the semi-custom integrated circuit SCIC is connected to the X0 terminal of multiplexer MX3. The X terminal thereof is connected to the Y terminal of multiplexer MX4 and to one side of an integrating capacitor C4. The Y1 terminal of multiplexer MX4 is connected to the Z0 terminal of multiplexer MX5. The Y0 terminal of multiplexer MX4 is connected by way of a resistive element R7 to ground. The Z terminal of the multiplexer MX5 is connected to the CH1 input terminal of the A to D converter ADC. The signal IOUT from the semi-custom integrated circuit or chip SCIC is a half-wave rectified signal, the analog portion of which is proportional to the sampled phase voltage from a phase of either SOURCE 1 or SOURCE 2 depending upon the sampling cycle. The multiplexers MX3, MX4 and MX5 are set up initially to integrate each of these half waves or cycles on a half cycle by half cycle basis. To do this the RESET logic signal is placed at a digital 1 level and the SAMPLE signal is placed at a digital 0 level by the microprocessor MP. This allows the half-wave analog signal to pass from the X0 terminal to the X terminal whereupon it is integrated by the capacitor C4. This value is then passed to the Y terminal of the multiplexer MX4 and thence through the Y1 terminal thereof to the Z0 terminal of the multiplexer MX5. However, since the common terminal Z of the multiplexer MX5 is internally connected to the Z1 terminal thereof at this time, the signal cannot get the A to D converter ADC. Integration continues to take place in the capacitor C4 until the SAMPLE control signal changes from the status of a digital 0 to that of a digital 1. When this happens the capacitor C4 is disconnected from the X0 terminal of the multiplex MX3 and thus stops integrating the IOUT analog signal. However, the Z output terminal of the multiplexer MX5 is now internally connected to the Z0 terminal thereof so that the A to D converter senses on channel CH1 thereof the peak value of the previous integration. This is a value which is proportional to the voltage on the particular phase line of the particular source being monitored. When the A to D conversion has taken place the entire operation is reset by placing a digital 0 control level or signal on the CAP-RESET line. This connects the Y terminal of multiplexer MX4 to the Y0 terminal thereof thus very quickly discharging the capacitor C4 through the resistive element R5. The resistive element R5 is chosen to be a relatively small to facilitate this. The circuit may then be set up to integrate the next succeeding half-wave signal on the output terminal IOUT of the semi-custom integrated chip SCIC.

Integrated analog information from multiplexer MX5 is supplied to terminal CH1 on the A-D converter ADC. There are three control terminals for the A-D converter ADC, namely, $\overline{RD}$ (not read), $\overline{WR}$ (not write) $\overline{CS}$ (not chip select). These terminals are fed respectively by the $\overline{RD}$, $\overline{WR}$ and the AD-CS control signals from the microprocessor MP in a manner to be described hereinafter. Reading, writing and chip selecting occurs when the respective control signal therefor goes low. Normally the control signal is at a logic 1 or high. There are eight digital output terminals DB0 through DB7 on the A-D converter ADC which supply data bus lines AD0 through AD7 on the ADDRESS-/DATA-BUS. Furthermore, information can travel to the A-D converter ADC from the microprocessor MP on the same ADDRESS/DATA-BUS. The normal operating sequence is as follows: The A-D converter ADC is selected by the $\overline{\text{AD-CS}}$ signal from the microprocessor MP and a write signal $\overline{\text{WR}}$ is provided to the A-D converter ADC at that time. The micro processor MP provides information to the ADDRESS/DATA-BUS to be written on the terminals DB0 through DB7 as a function of the actuation of the $\overline{\text{WR}}$ terminal. This tells the A-D converter ADC to select CH1 and to begin an A-D conversion of the information present thereon. This information is the previously integrated phase voltage information present on the Z terminal of the multiplexer MX5. After a suitable period of time which may approximate 40 microseconds, for example, for the A-D conversion to take place the write signal $\overline{\text{WR}}$ goes high and the read signal $\overline{\text{RD}}$ goes low, thus telling the A-D converter to provide the digital information which has been converted from analog by the A-D converter ADC to the lines AD0 through AD7 for subsequent routing to the microprocessor MP by way of the ADDRESS/DATA-BUS.

Figure 5H:
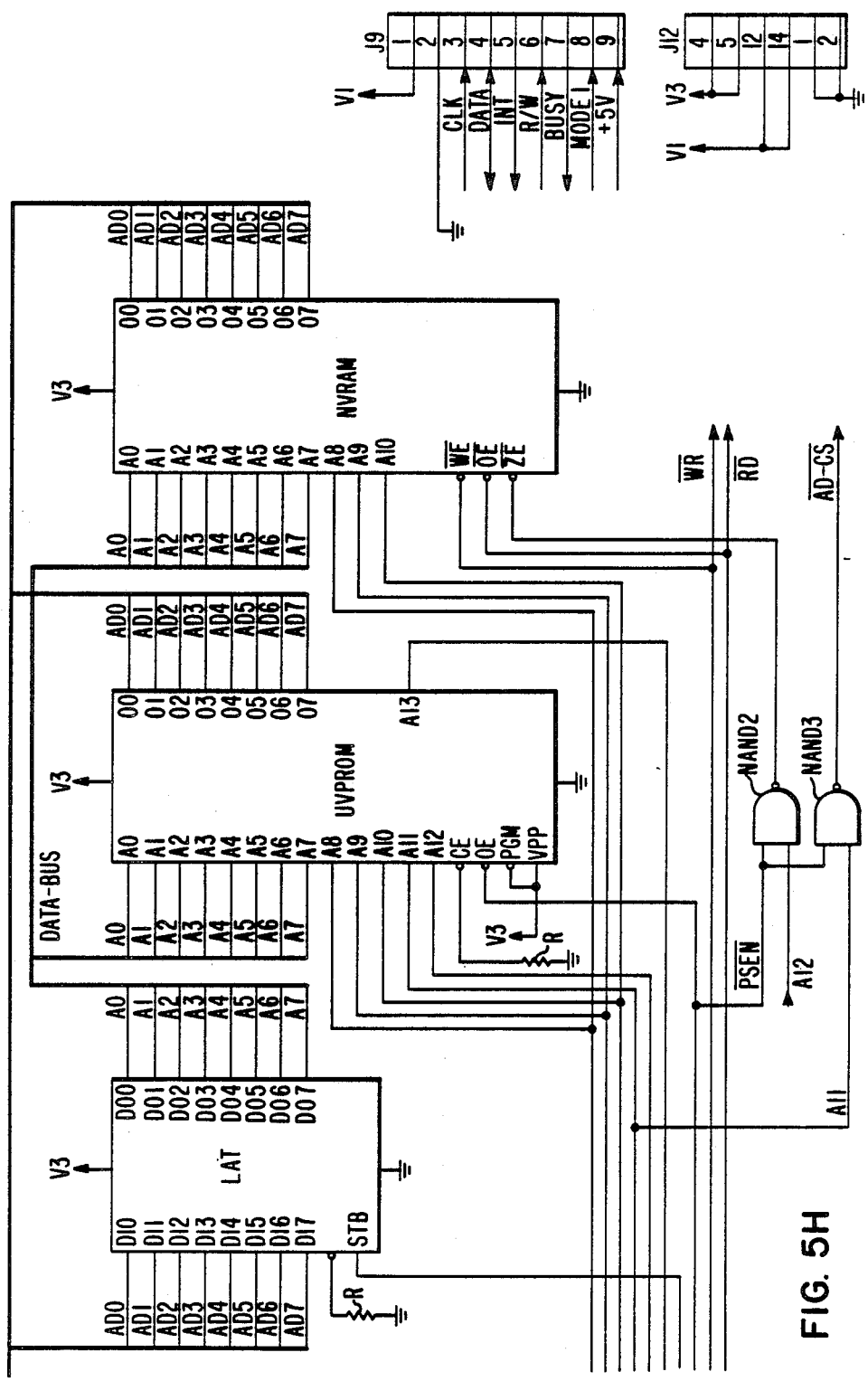
Figure 5J:
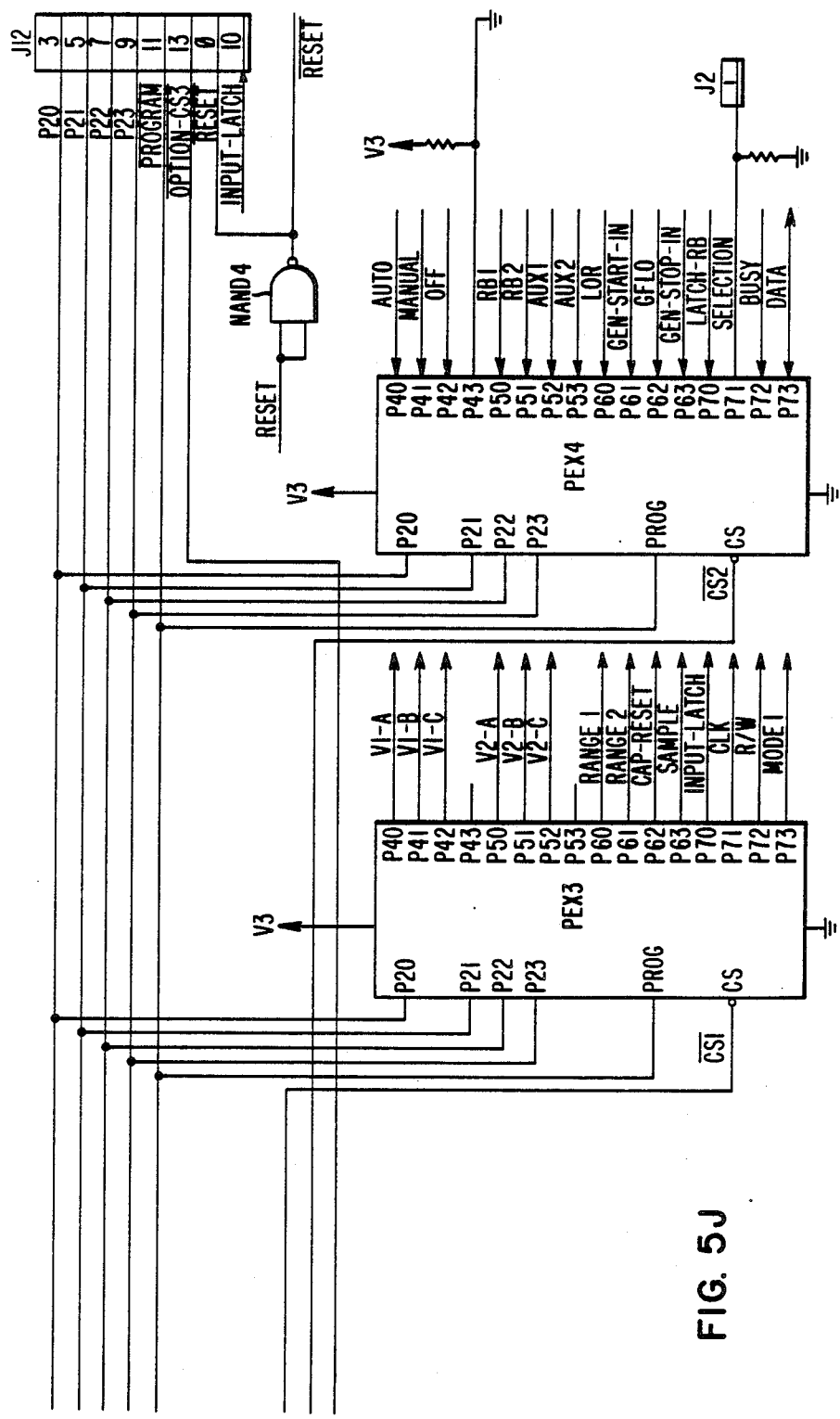
Figure 5K:
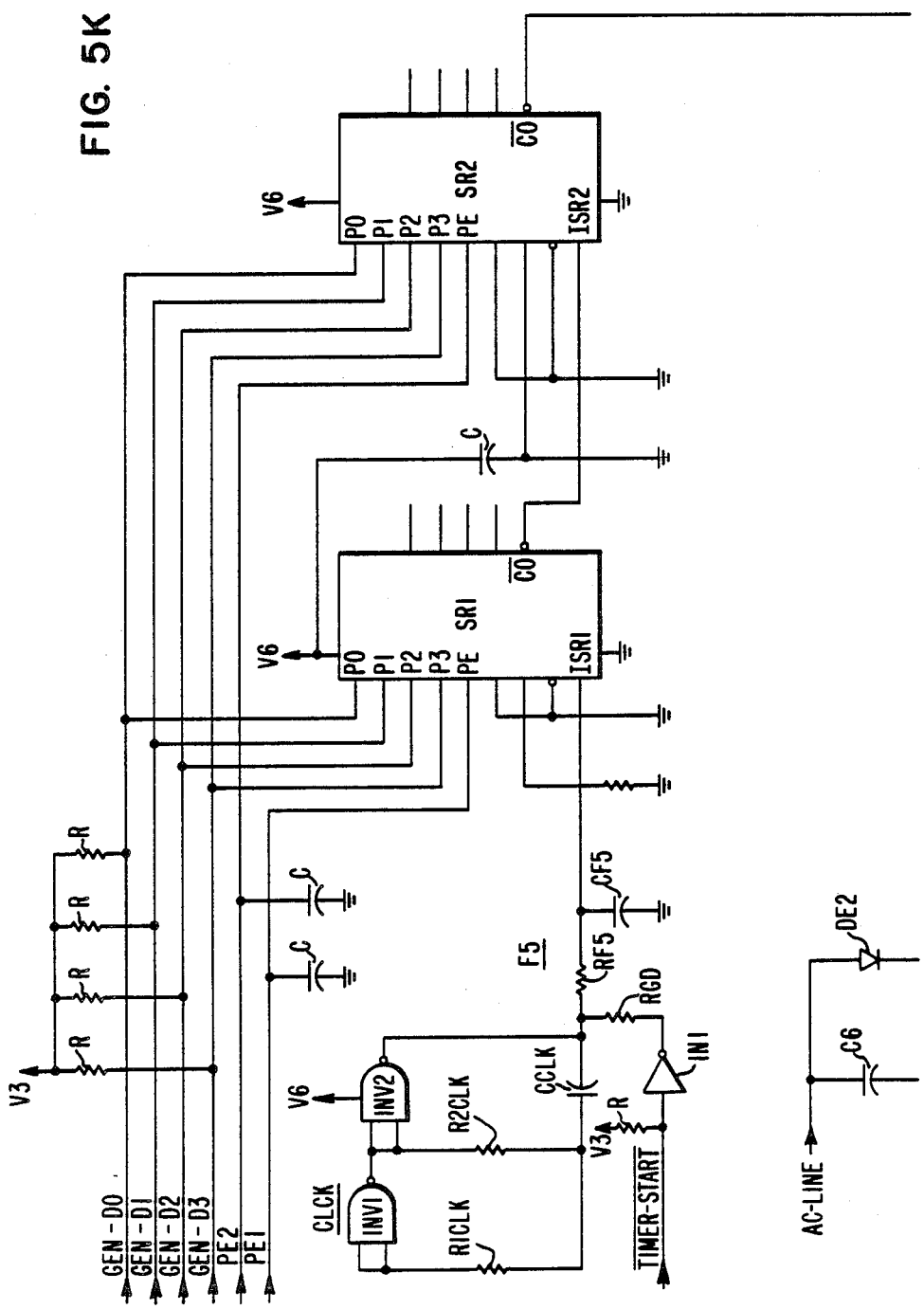
Figure 5L:
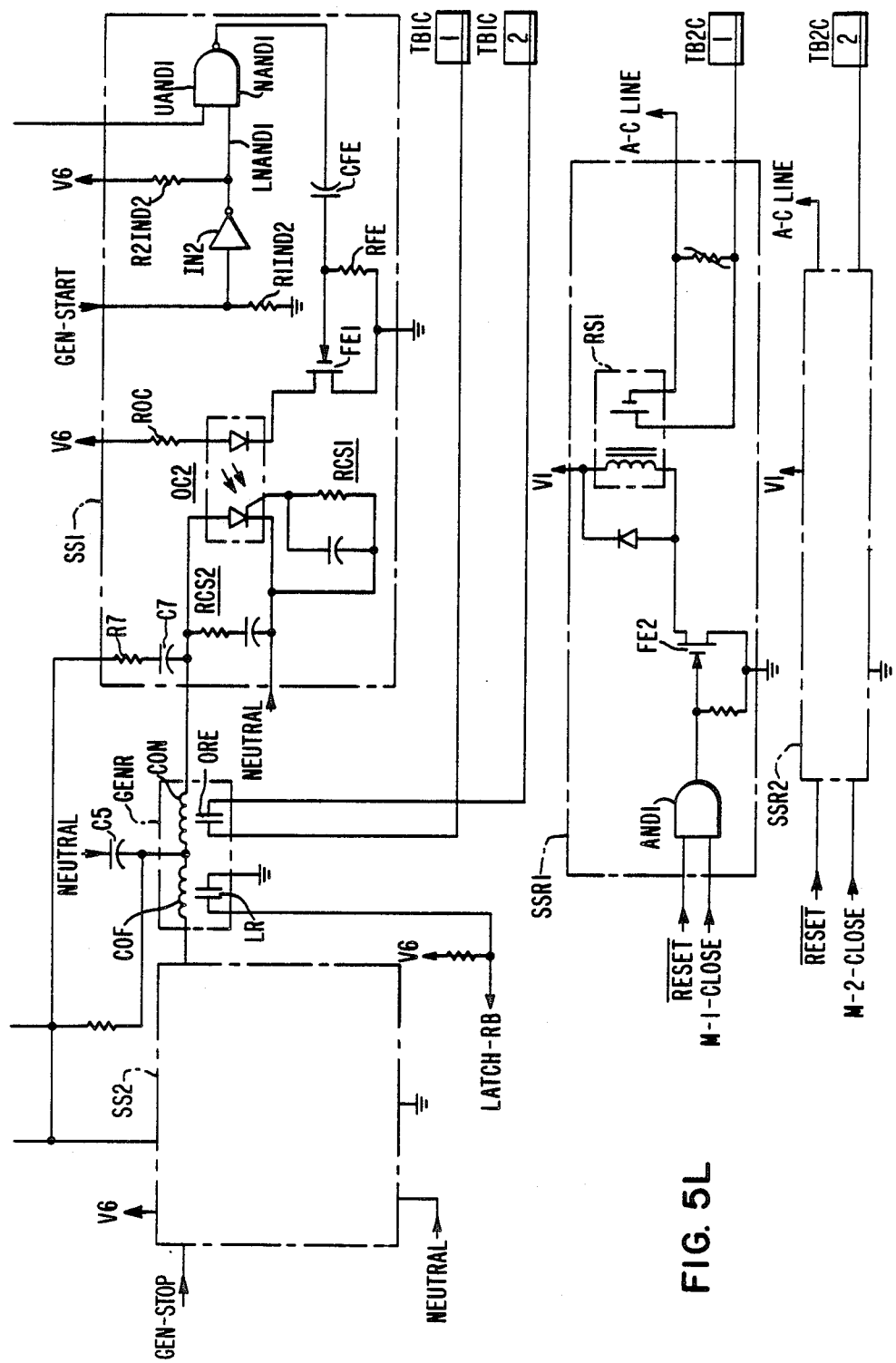

Referring to FIGS. 4 and 5K and 5L, before a detailed explanation of the interaction of the microprocessor MP and its various memories and input and output devices is undertaken it is desirable at this time to describe the output devices for the controller 12. As was described previously, terminals 1 and 2 of terminal board TB1C may be interconnected with an auxiliary generator starting system 62 which may comprise a DC battery DCB as part thereof. If the controller 12 internally interconnects terminals 1 and 2 of terminal board TB1C, the battery DCB will be interconnected to energize this starting circuit 62 thus starting the auxiliary generator G. On the other hand, if the controller 12 internally interrupts electricity continually between terminals 1 and 2 of terminal board TB1C, the generator starting circuit 62 is deenergized. There are shown two shift registers SR1 and SR2. These are interconnected at terminals P0, P1, P2 and P3 thereof with the parallel lines GEN-D0, GEN-D1, GEN-D2 and GEN-D3 respectively. Furthermore, input line PE1 is interconnected with the shift register enable terminal PE of shift register SR1, and input line PE2 is interconnected with shift register enable terminal PE of shift register SR2. There is also provided a clock CLCK which includes two inverters INV1 and INV2 interconnected with each other, resistors R1CLK, R2CLK and capacitor CCLK as is shown in the RCA CMOS data book, page 718, thereof for forming a free running 1 hertz clock. This 1 hertz clock CLCK and the shift registers SR1 and SR2 are empowered by V6. Clock CLCK is interconnected with a filter F5 comprising a resistor RF5 and a capacitor CF5. The output of filter F5 is connected to an input terminal ISR1 of the shift register SR1. The $\overline{\text{Co}}$ output terminal of the shift register SR1 is interconnected with the shift register input terminal ISR2 of shift register SR2. The output $\overline{\text{Co}}$ from the shift register SR2 is connected to the upper input terminal UNAND1 of a nand gate NAND1. The shift register SR1 is connected in series with the shift register SR2 so that an overall eight bit shift register system is formed from the combination of the shift registers SR1 and SR2. The shift registers SR1 and SR2 are loaded by combinations of digital ones and digital zeros on the lines GEN-D0 through GEN-D3 as a function of which of the shift register enable signals PE1 or PE2 is high or in an actuating state at any instant of time. These signals are provided from the microprocessor MP in a manner to be described hereinafter. Normally the free running clock CLCK down counts the shift registers SR1 and SR2 as a function of the digital coding loaded into each by GEN-D0 through GEN-D3 thus producing an output pulse at the end of a time determined by the previously described digital coding. If digital ones are on all the lines GEN-D0 through GEN-D3 for both the shift register SR1 and shift register SR2 (maximum condition), then a 256 bit countdown takes place with the clock CLCK oscillating at the rate 1 hertz; it therefore takes approximately 4 minutes for an output signal to be produced from the output $\overline{\text{Co}}$ of shift register SR2. This provides a timer which has a maximum capacity of approximately 4 minutes, but which can be programmed for less depending upon the combinations of ones and zeros on the lines GEN-D0 through GEN-D3. The clock CLCK is prevented, however, from actuating the shift register combination SR1–SR2 by the $\overline{\text{TIMER-START}}$ signal which is a holdoff signal provided by the microprocessor MP in a manner to be described hereinafter. This signal is provided to the input of an open collector inverter IN1. If the $\overline{\text{TIMER-START}}$ signal is high, as it is most of the time, then the output of the inverter IN1 is zero and the 1 hertz clock signal from the clock CLCK is shunted to ground i.e. the output of inverter IN1 through resistor RGD and away from input of the shift register SR1. However, if the $\overline{\text{TIMER-START}}$ signal goes low, the inverter IN1 goes into its open collector state and the clock CLCK begins to operate on the combination of the previously described shift registers SR1 and SR2 until a sufficient number of 1 hertz clock pulses has been counted to cause an output signal to emanate from the shift registers SR2. The outputs $\overline{\text{Co}}$ for the shift registers SR1 or SR2 are normally at a high or digital one level until a shift takes place in which case they go lower to a digital zero level. The nand gate NAND1 is such that a zero on any input terminal thereof will produce a one on the output terminal thereof. But ones on both input terminals are necessary to produce a zero on the output terminal thereof. The normal state is for zero to be on the output terminal of the nand gate NAND1. The microprocessor MP supplies a signal GEN-START to an inverter IN2. The latter signal is normally low until a generator start action is desired in which case it goes high placing a digital zero on the output of the inverter IN2 which output is interconnected with the other input terminal LNAND1 of nand gate NAND1. A digital zero on any of the input terminals of the nand gate NAND1 will put a one on the output thereof thus causing an action to take place which will cause energization of the starting cicruit for the generator G as previously described. The nand gate NAND1 is part of a starting circuit SS1. The starting circuit SS1 also includes a field effect transistor FE1, the "gate" of which is connected to the output of nand gate NAND1 by way of a filter FRE-CFE. The "source" of transistor FE1 is connected through the light emitting diode portion of an optocoupler OC2 and a resistor ROC to the power supply voltage +V3. The gate of the transistor portion of the optocoupler OC2 is connected by way of a resistor-capacitor snubber circuit RCS1 to the NEUTRAL line. There is provided across the anode-to-cathode circuit of the optically-coupled transistor in the optocoupled circuit OC2 a snubber circuit RCS2 comprising a resistor and a capacitor. The anode of the previously described optical-coupled transistor is connected to a generator relay circuit GENR which comprises two coils CON and COF and two magnetically latched relay contacts ORE and LR. Energization of the coil CON closes the relay contacts ORE and LR while energization of the coil COF opens the relay contacts ORE and LR. The midpoint for the coils CON and COF is interconnected with a capacitive element C5 and NEUTRAL on one branceand the AC-LINE by way of a diode DE2 which acts as a halfwave bridge rectifier on another branch. The positive going AC signal from the AC-LINE is supplied to the coils CON or COF as a function of the status of the optocoupler OC2. It is a characteristic of the optically-coupled thyristor of the optocoupler OC2 to remain in the on state until the anode-to-cathode voltage thereof drops below zero. For this reason capacitive element C7 and resistive element R7 are interconnected between the anode of the thyristor of opto coupler OCL and the cathode of the diode DE2. This cooperates with diode paralleling capacitive element C6 to provide a high impedance path for the negative half cycles of the AC voltage on the line AC-LINE to guarantee that the latter thyristor will turn off after it has been energized. The circuit SS2 is a duplicate of the circuit SS1 except that it is interconnected with the GEN-STOP signal from the microprocessor MP. Either the GEN-START signal or the previously described output signal from the shift register SR2 will energize the coil CON of the generator relay GENR to cause the output relay ORE to close to thus interconnect terminals 1 and 2 of terminal board TB1C to cause the output latch relay LR to close to thus provide the LATCH-RB output signal to alert the microprocessor MP to the status of the internal interconnection between the terminals 1 and 2 of terminal board TB1C. On the other hand, the presence of the GEN-STOP signal at the input of circuit SS2 will cause the coil COF to be energized thus opening the relays ORE and LR if in fact they are closed. This of course will remove the LATCH-RB signal and will open the circuit between the terminals 1 and 2 of the terminal board TB1C.

Two other output terminals are terminals 1 and 2 of terminal board TB2C. As was described previously, with respect to FIG. 3, terminal 1 of terminal board TB2C is connected to the closing coil CC MAIN 1 for circuit breaker MAIN 1, and terminal 2 of terminal board TB2C is connected to the closing coil CC MAIN 2 for circuit breaker MAIN 2. Terminal 1 of terminal board TB2C is interconnected internally with a source relay circuit SSR1, and terminal 2 of terminal board TB2C is interconnected internally with a source relay circuit SSR2. Circuits SSR1 and SSR2 may be duplicates of each other. The source relay circuit SR1 has as an input device an AND gate AND1, the output of which is connected to the gate of a field effect transistor FE2. The source of Transistor FE2 is connected to the V1 power supply terminal by way of a coil driven relay circuit RS1. The coil driven relay circuit RS1 has the relay output thereof connected between terminal 1 of terminal board TB2 and the AC-LINE so that if the relay circuit RS1 is closed, power is provided to close circuit breaker MAIN 1 through its cooling coil CC MAIN 1. The inputs to the AND gate AND1 are the $\overline{RESET}$ signal and the M-1-CLOSED signal. If the M-1-CLOSED signal is present, and the circuit is not reset a digital one will appear at the output of the AND gate AND1 which will turn the field effects transistor FE2 on thus channeling energy from the power supply V1 through the relay coil of circuit RS1. The input data for the source relay SR2 is the same $\overline{RESET}$ signal and the M-2-CLOSE signal MP. If either the M-1-CLOSE or M-2-CLOSE signals are present and the $\overline{RESET}$ signal is present then the associated circuit breaker MAIN 1 and MAIN 2 for SOURCE 1 and SOURCE 2 will be closed thus routing the power from SOURCE 1 and SOURCE 2 to the load LD.

Referring now to FIGS. 6A through 6D the circuit diagram for the front panel 16 shown in FIG. 2 is depicted. There are provided three serially interconnected shift registers SHR2, SHR3 and SHR4. Furthermore, there is a fourth shift register SHR5 which is not serially interconnected with the previously described three shift registers but nevertheless provides a valuable function for the front panel in a manner which will be described hereinafter. All of the clock input terminals CLK of the shift registers SHR2 through SHR5 are interconnected to receive the CLOCK signal from the microprocessor MP as supplied on terminal 5 of terminal board J1. Furthermore, there is provided on terminal 7 of terminal board J1 the STROBE-OUT signal which is supplied to the STR input terminal of the shift registers SHR2 through SHR4. There is provided on terminal 6 of terminal board J1 the STROBE-IN signal which is supplied to P/SC input terminal of the shift register SHR5. The STROBE-OUT, STROBE-IN and CLOCK signals are all input signals for the front panel 16. There is provided on terminal 3 of terminal board J1 and FP-DATA link which is interconnected with the DTA input terminal of the shift register SHR2 and the Q8 terminal of the shift register SHR5 for providing data to the front panel 16 from the microprocessor MP and for sending data from the front panel 16 to the microprocessor MP. The Q'S output terminal of the shift register SHR2 is interconnected with the DTA input terminal of shift register SHR3. The Q'S output terminal of the shift register SHR3 is interconnected with the DTA input terminal of shift register SHR4. The Q2 through Q8 output terminals of the shift register SHR2 carry the D6 through D0 data signals respectively. The Q1 through Q4 output terminal of the shift register SHR3 carry the $\overline{CE4}$ through $\overline{CE1}$ output signal for the shift register SHR3. The Q5 output terminal thereof provides the CU output signal. The Q7 and Q8 output terminals thereof provide the A1 and A0 signals. The Q3 output terminal of the shift register SHR4 is interconnected with the input terminals of inverters INV2 and INV3. The output of the inverter INV2 is connected to a light emitting diode designated PROGRAM and thence through a resistor R8 to the V3 power supply terminal. The output of the inverter INV3 is connected to the input of an inverter INV4 and from thence through the light emitting diode entitled OPERATIONAL and thence through a resistor to the V3 power supply. The outputs Q4 through Q8 of the shift register SR4 are connected by way of similar inverters through similar light emitting diodes and similar resistors in a manner similar to that described with respect to inverter INV2, light emitting diode PROGRAM and resistor R6. The remaining L.E.D. outputs are designated MAIN 1, MAIN 2, TIE, SOURCE 1 AVAILABLE, and SOURCE 2 AVAILABLE respectively. These light emitting diodes are also shown on the front panel 16 in FIG. 2 as described previously. Connected to the P1 input of the shift register SHR5 is an output terminal of the previously described key switch 20. Connected to the P2 input terminal of the shift register SHR5 is the STEP pushbutton. Connected to the P3, P4 and P5 input terminals of the shift register SHR5 are the RAISE, LOWER, and LOCK-OUT RESET pushbuttons of the front panel 16 of FIG. 2.

There are provided four four character output display devices 18A through 18D which make up the 16 character front panel FUNCTION display 18 of FIG. 2. Each of the four devices 18A through 18D has a character display numbered 0 through 3, thus providing 16 total read-out cells (4×4). Connected to the D0 through D6 input terminal of each of the elements 18A through 18D are the D0 through D6 lines respectively from shift registers SHR2. Likewise, connected to the A1 through A0 inputs are the A1 and A0 lines respectively. Connected to the $\overline{CE}$ input of each of the devices 18A through 18D are the $\overline{CE1}$ through $\overline{CE4}$ input signals with the $\overline{CE1}$ input signal going the module 18A, $\overline{CE2}$ going to 18B, $\overline{CE3}$ going to 18C and $\overline{CE4}$ going to 18D. Furthermore, the signal $\overline{CU}$ goes to the $\overline{CU}$ terminal of each of the modules. Lastly a write signal $\overline{W}$ goes to the $\overline{W}$ input terminal of each of the modules. In a typical operating cycle for the front panel, 24 bits of information or a digital word is provided on the FP-DATA line in synchronism with the CLOCK signal to the three serially connected shift registers SHR2 through SHR4. The first Z bits of data (where in one embodiment Z=6) get passed through SHR2 and SHR3 to finally reside in shift register SHR4. This is information for controlling the light emitting diodes or indicating devices described previously. The next N bits of data (wherein one embodiment N=7) gets passed through SHR2 to finally reside in shift register SHR3. This information is associated with the signals $\overline{CE1}$ through $\overline{CE4}$, CU, A1 and A0. In this embodiment signals $\overline{CE1}$ through $\overline{CE4}$ choose 4 clusters of display devices and A1, A2 pick one of 4 display devices for each of the clusters. In this case N equals 7 and M the number of display devices equals 16. The last X bits of data finally reside on lines D0 through D6 of shift register SHR2. They represent ASCII digits for each subpart of each module 18B. In this embodiment X=7. Consequently in order to provide information to all 16 characters on modules 18A through 18D, 16 sets (one message) of 20 bits of data (one word) are loaded sequentially into the shift registers SHR2 through SHR4. A "word" may contain less or more than 20 bits of data. For instance the information associated with the N and Y bits may comprise a word. At the end of each 20 bits of data the CLOCK and FP-DATA lines go down and the output STROBE signal moves the stored information to the various output terminals Q1, Q2 etc. of the shift registers SHR2 through SHR4.

A digital 1 on the input of any of the inverters INV2, INV3, etc. which are connected to the output of the shift register SHR4 will cause a light emitting diode to illuminate (with the exception of the branch including the inverter INV4 which operates in a complimentary fashion with the branch including the inverter INV2). This circuitry operates to indicate the status of the various circuit breakers or the status of the key switch 20. The microprocessor MP alternately chooses in series each of the 4 display characters in each of the 4 modules 18A through 18D. It does this by utilization of the chip enable signals CE1 through $\overline{CE4}$ to pick the appropriate module 18A through 18D respectively; and the A1 through A0 signals to pick the appropriate display reel, 0 through 3 within the module. Once this is done the write signal $\overline{W}$ is activated to cause the appropriately chosen displays to illuminate. The displays are illuminated in sequence. However, the repetition rate is so high that it looks as if all 16 displays illuminate at the same time providing a 16 character message. Consequently, it can be seen that once per read-in cycle of 20 bits of data (one digital word) the light emitting diodes are updated and one character of the 16 characters for the front panel is updated. At the end of 16 such repetitions the entire 16 front panel display characters are updated. Furthermore, interspaced therewith after each 20 bit cluster of data corresponding to the illumination of 1 of the 16 characters the microprocessor MP places the FP-DATA line into a read mode in which case the outout of the shift register SHR5 is actuated by the STROBE-IN signal and 8 repetitions of the clock pulse CLOCK. Data is then sent from shift register SR5 to the microprocessor MP by way of the front panel data line FP-DATA. This determines the status of the key switch 20 and the other 4 switches STEP, RAISE, LOWER and LOCK-OUT RESET. When the key switch 20 is in the OPERATION mode, the LOCK-OUT RESET switch can be utilized. The LOCK-OUT RESET switch cannot be utilized when the switch 20 is in the PROGRAM mode. When the switch 20 is in the OPERATION mode the RAISE pushbutton is ineffective. However when switch 20 is in the PROGRAM mode, the LOWER pushbutton operates when actuated to cause the microprocessor MP to cause display of previously set setpoints. Utilization of the STEP pushbutton in this situation iterates the display through the various setpoints which have previously been set. When switch 20 is first placed in the PROGRAM mode, a first setpoint from a predetermined menu of setpoints, described hereinafter with respect to CHART 1, is depicted on the front panel in the manor previously described for providing information on the 16 display characters. A user may select combinations of available options from the menu of CHART 1. This data may be adjusted upward or lower by depressing the RAISE or LOWER pushbuttons respectively. This signals the output of the shift register SHR5 to provide data to the microprocessor MP which causes a predetermined incremental raising or lowering of the stored setpoint data and concurrent display thereof in an incremental fashion for each depression of the RAISE or LOWER pushbutton. When it is desired to move to the next display for adjustment, actuation of the STEP pushbutton causes the next sequential item from the menu of setpoints to be displayed. The LOCK-OUT RESET only works when the switch 20 is in the OPERATION mode and it occurs after a ground fault condition has caused a combination of the various circuit breakers MAIN 1, MAIN 2, etc. to open. Under this condition a positive action of actuating the LOCK-OUT RESET pushbutton must take place before automatic action for controlling the various circuit breakers can take place again. In a typical normal operation with the switch 20 in the OPERATION mode, the message "WESTING-HOUSE ATS" (see No. 41 in Chart 1) is displayed at the 16 character final panel display 18. Repeated Actuation of the STEP pushbutton when switch 20 is in the OPERATIONAL mode will call up new display messages. Repeated actuation of the STEP pushbutton under the foregoing condition may change the particular message sequentially from "48" to "51" on the menu of CHART 1. This will continue so long as the STEP pushbutton is actuated repeatedly while the switch 20 is in the OPERATIONAL mode, unless a problem develops in which case an automatic override may cause action to take place with respect to various circuit interruptor devices for switching devices controlled by the controller 10. In that case the problem which causes the action to take place is depicted on the 16 bit display and the time until corrective action will commence is depicted alternately on a 1 second oscillatary basis until the corrective action actually takes place. If during the timing out process for taking corrective action the problem disappears, the automatic override system will abort and the operation will revert to the normal mode as described previously.

CHART 1

| Menu of Setpoints and Messages Available to a User as Depicted on Front Panel Display | |
|---|---|
| Message | Comment |
| 1. BUS FREQ __ HZ | value range - 50 or 60 |
| 2. BUS VOLTAGE __ V | value range - 69 to 600 |
| 3. # OF BREAKERS __ | value range - 2 or 3 |
| 4. N UNDER VOLTS __ | value range - YES or NO |
| 5. N-UNDER VOLTAGE | |
| 6. N-DROPOUT __ % V | value range - 60 to 89 |
| 7. N-PICKUP __ % V | value range - 75 to 100 |
| 8. E UNDER VOLTS __ | value range - YES or NO |
| 9. E-UNDER VOLTAGE | |
| 10. E-DROPOUT __ % V | value range - 60 to 89 |
| 11. E-PICKUP __ % V | |
| 12. N OVER VOLTS __ | value range - YES or NO |
| 13. N-OVER VOLTAGE | |
| 14. N-DROPOUT __ % V | value range - 110 to 120 |
| 15. N-PICKUP __ % V | value range - 95 to 109 |
| 16. E OVER VOLTS __ | value range - YES or NO |
| 17. E-OVER VOLTAGE | |
| 18. E-DROPOUT __ % V | value range - 110 to 120 |
| 19. E-PICKUP __ % V | value range - 95 to 109 |
| 20. TRANSFER N-E __ S M | value range - 0 to 59 s 1 to 30 m |
| 21. TRANSFER E-N __ S M | value range - 0 to 59 s 1 to 30 m |
| 22. NEUTRAL __ SEC | value range - 0 to 60 |
| 23. N-UNDER FREQ __ | setpoint range is - YES or NO |
| 24. N-UNDER FREQ __ HZ | setpoint range is - 43 to 60 |
| 25. N-OVER FREQ __ | setpoint range is - YES or NO |
| 26. N-OVER FREQ __ HZ | setpoint range is - 50 to 67 |
| 27. E-UNDER FREQ __ | setpoint range is - YES or NO |
| 28. E-UNDER FREQ __ HZ | setpoint range is - 43 to 60 |
| 29. E-OVER FREQ __ | setpoint range is - YES or NO |
| 30. E-OVER FREQ __ HZ | setpoint range is - 50 to 67 |
| 31. COOL DOWN __ MIN | setpoint range is - 0 to 30 |
| 32. GEN. EXERCISER __ | setpoint range is - YES or NO |
| 33. CLK TIME/DAY = __ | range is - SUN, MON, TUE, WED, THU, FRI, and SAT |
| 34. TIME HR = __: XXAM XXPM | setpoint range is - 12AM to 11PM |
| 35. MINUTES_ XX: __ AM PM | setpoint range is - 0 to 59 |
| 36. __ GEN TRANSFER | setpoint range is - YES or NO |
| 37. GEN RUN TIME __ M | setpoint range is - 0 to 45 |
| 38. GEN EXER DAY = __ | range is - SUN, MON, TUE, WED, THU, FRI, SAT |
| 39. EXERCISE AT __ AM | setpoint range is - 12AM to 11PM |
| 40. PREFER SOURCE __ | setpoint range is - N or E |
| 41. WESTINGHOUSE ATS | |
| 42. PLEASE SET TIME | |
| 43. MEMORY CHECK | |
| 44. CALC. SETPOINTS | |
| 45. ROM ERROR | |
| 46. RAM ERROR | |
| 47. EEPROM ERROR | |
| 48. NORMAL __ VOLTS | |
| 49. EMERGE. __ VOLTS | |
| 50. N-FREQUENCY __ HZ | |
| 51. E-FREQUENCY __ HZ | |
| 52. TIME __:__ | |
| 53. N UNDER VOLTAGE | |
| 54. N OVER VOLTAGE | |
| 55. E UNDER VOLTAGE | |
| 56. E OVER VOLTAGE | |
| 57. NORMAL UNDER HZ | |
| 58. NORMAL OVER HZ | |
| 59. EMERGE. UNDER HZ | |

CHART 1-continued

| Menu of Setpoints and Messages Available to a User as Depicted on Front Panel Display | |
|---|---|
| Message | Comment |
| 60. EMERGE. OVER HZ | |
| 61. MANUAL TRANSFER | |
| 62. RETRANSFER __:__ | |
| 63. MAN. RETURN REQD. | |
| 64. GEN START __:__ | |
| 65. GEN EXERCISE __ M | |

Referring now to FIGS. 5F, 5G, 5H, 5J and 7B the interconnection and use of port expanders will be described. In particular, port expander PEX1 is on the option board shown in FIG. 7B while port expanders PEX2 through PEX4 are on the main board. The port expanders perform the function of interconnecting the microprocessor MP with 4 service links in clusters of 4 per port expander. Each port expander has microprocessor link terminals P20, P21, P22 and P23 which are tied together respectively with a terminal P10 through P13 of the microprocessor MP. Terminals P20 are tied to P10, terminals P21 are tied to P11 etc. On each port expander terminal P20 is internally interlinked with service terminals P40, P41, P42 and P43; terminal P21 is interlinked with service terminals P50, P51, P52 and P53; terminal P22 is interlinked with service terminals P60, P61, P62 and P63; and terminal P23 is interlinked with service terminals P70, P71, P72, and P73. Information may flow between the microprocessor link terminals and the expanded service terminals or vice versa, either exclusively or nonexclusively depending on the interconnection desired. For example, the PE1 signal on the service terminal P41 only operates as output from the microprocessor MP through microprocessor link terminal P20 of port expander PEX2. On the other hand the MANUAL signal on the service terminal P41 of the port expander PEX4 is only provided as input to the microprocessor MP by way of microprocessor link terminal P20 of port expander PEX4. Still again the DATA signal on service terminal P73 of port expander PEX4 carries data to or from the microprocessor MP by way of microprocessor link terminal P23 on the port expander PEX4. The microprocessor MP communicates with a port expander selector PEXS by way of lines interconnected with terminals P14 through P16 of the microprocessor MP. The latter three lines are interconnected with terminals A, B and C of the port expander selector PEXS. The $\overline{Y0}$ terminal of the port expander selector PESX is connected with the $\overline{CS}$ or chip select input terminal of the port expander PEX2. The $\overline{Y1}$, $\overline{Y2}$ and $\overline{Y3}$ output terminals of the port expander selector PESX are interconnected respectively with the $\overline{CS}$ terminals of the port expanders PEX3, PEX4 and PEX1. The chip select signals from the port expander selector PEXS are designated $\overline{CS0}$, $\overline{CS1}$, $\overline{CS2}$, and $\overline{CS3}$ for port expanders PEX2, PEX3, PEX4 and PEX1 respectively. By referring to CHART 2 the various signals on each of the port expanders PEX1 through PEX4 for the service terminals P40 through P73 as described previously are shown. The use of many of these signals has been described previously and the use of others will be described hereinafter. The output of the multiplexer MP at terminal P17 is interconnected with the program PROG input terminal of each of the aforementioned port exapnders.

CHART 2

| Service Terminals | PEX1 | PEX2 | PEX3 | PEX4 | Microprocessor Link Terminal |
|---|---|---|---|---|---|
| P40 | OPTION | TIMER-START | V1-A | AUTO | |
| P41 | TRIP1 | PE1 | V1-B | MANUAL | |
| P42 | TRIP2 | PE2 | V1-C | OFF | P20 |
| P43 | TIE-TRIP-IN | GEN-START | X | X | |
| P50 | CLOSE1 | GEN-D0 | V2-A | RB1 | |
| P51 | CLOSE2 | GEN-D1 | V2-B | RB2 | |
| P52 | CLOSE-TIE-IN | GEN-D2 | V2-C | AUX1 | P21 |
| P53 | RB-TIE | GEN-D3 | X | AUX2 | |
| P60 | SPARE-IN | STROBE-OUT | RANGE1 | LOR | |
| P61 | JUMP2 | STROBE-IN | RANGE2 | GEN-START-IN | |
| P62 | X | DEADMAN | GAP-RESET | GFLO | P22 |
| P63 | X | GEN-STOP | SAMPLE | GEN-STOP-IN | |
| P70 | M-1-TRIP | CONTROL-PW | INPUT-LATCH | LATCH-RB | |
| P71 | M-2-TRIP | M-1-CLOSE | CLK | SELECTION | |
| P72 | TIE-TRIP | M-2-CLOSE | R/W | BUSY | P23 |
| P73 | TIE-CLOSE | X | MODE1 | DATA* | |
| | P-40 P-61 inputs | All Outputs | All Outputs | All Inputs Except * Which is Also Output | |
| | P-70 P-73 outputs | | | | |

Figure 7A:
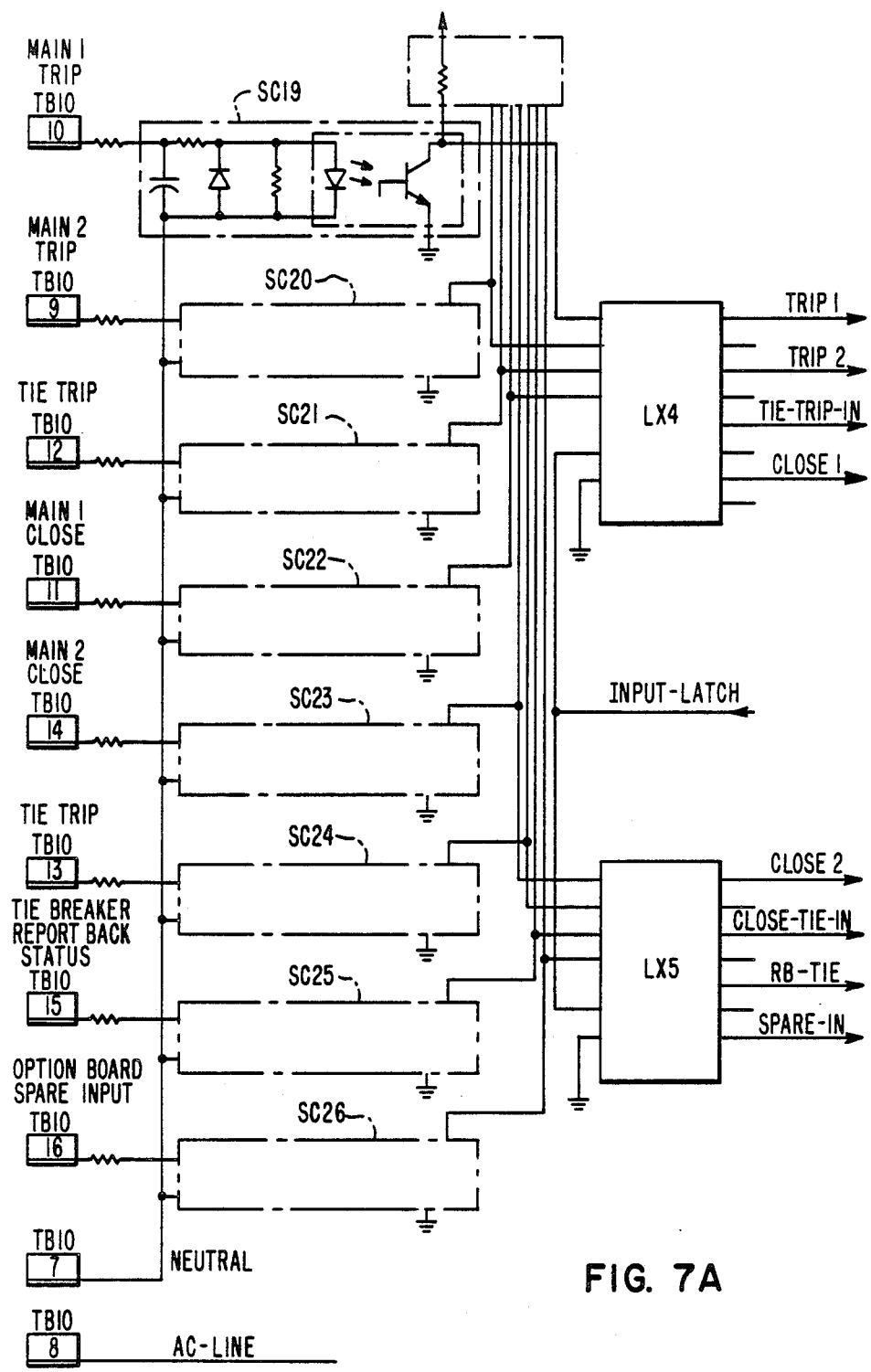
FIGS. 7A and 7B show a schematic representation of the option board of FIG. 3.
Figure 7B:
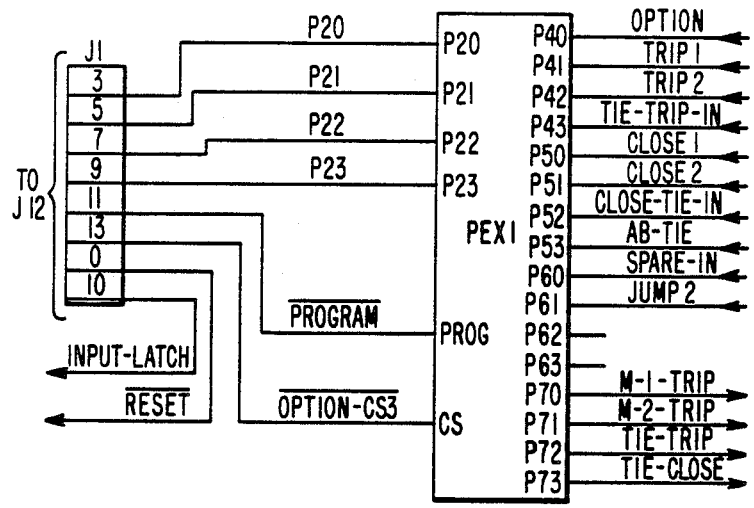
Figure 7B:
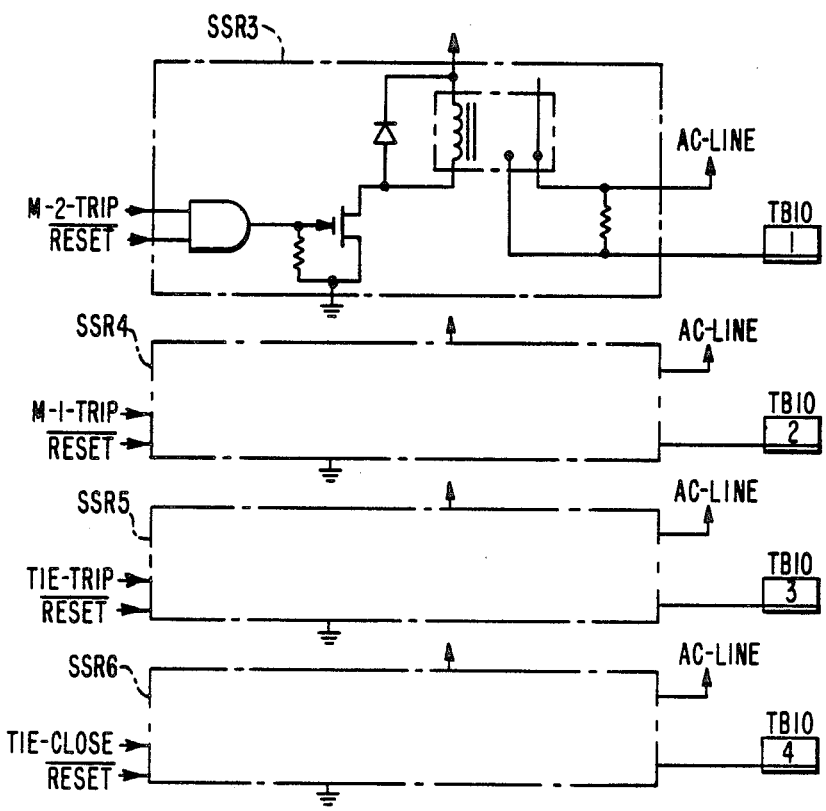

Referring specifically to FIGS. 7A and 7B the "option board" 22 shown in FIG. 3 is depicted once again in block diagram form. By associating the terminals from the terminal board TB10 with the designations and interconnections shown in FIG. 3 a better understanding of the operation of the option board 22 with respect to the devices to be controlled by the controller 12 is possible. Each of the input terminals TB10 7 through 16 if interconnected as shown in FIG. 3 with external circuitry for the apparatus controlled by the controller 12. Internally each of the terminals is interconnected with a signal conditioner SC19 through SC26. The signal conditioners SC19 through SC26 may be essentially the same as that depicted with respect to FIG. 5C designated SC7 through SC18. The input to signal conditions SC19 through SC22 are terminals 10, 9, 12 and 11 respectively of terminal board TB10. The inputs for signal conditioners SC23 through SC26 are terminals 14, 13, 15 and 16 of terminal board TB10, respectively. The outputs of signal conditioners SC19 through SC22 are connected to latch LX4 at input terminals D1 through D4 thereof respectively and the output terminals of signal conditioners SC23 through SC26 are connected to output terminals D1 through D4 of latch LX5. The outputs of latch LX4 corresponding to inputs D1 through D4 respectively are TRIP1, TRIP2, TIE-TRIP-IN, and CLOSE1 respectively and the outputs for inputs D1 through D4 of latch LX5 are CLOSE2, CLOSE-TIE-IN, RB-TIE, and SPARE-IN respectively. These inputs are connected to the port expander PEX1 at the service terminals of PEX1 in the following sequence TRIP1/P41, TRIP2/P42, TIE-TRIP-IN/P43, CLOSE1/P50, CLOSE2/P51, CLOSE-TIE-IN/P52, RB-TIE/P53 and SPARE-IN/P60. The outputs for control terminals 1 through 4 of terminal board TB10 are connected respectively to relay circuits SSR3 through SSR6 respectively. Relay circuits SSR3 through SSR6 may be the same as relay circuit SSR1 for example, described previously with respect to FIG. 5L. The input signals for the relays SSR3 through SSR6 are the $\overline{RESET}$ in all cases and the M-2-TRIP for SSR3; the M-1-TRIP for SSR4; the TIE-TRIP for SSR5 and the TIE-CLOSE for SSR6. These signals come from the P70 et sequal series of service terminals for the port expander PEX1. The INPUT-LATCH signal is provided to each of the latches LX4 and LX5. The INPUT-LATCH signal comes from terminal 10 of connector J1 and the $\overline{RESET}$ signal comes from terminal 0 of connector J1. Connector J1 on the option board is interconnected with connector J12 on the main board by way of the line 24.

Referring now to FIG. 5F and 5H there are shown a microcontroller or microprocessor MP interacting with a latch LAT, an ultraviolet programmable read-only-memory UVPROM and an electrically erasable programmable memory NVRAM (called EEPROM in Chart 1). The basic synchronizing or timing device for the microprocessor MP is interconnected to the terminals X1 and X2 thereof. It is driven by a six megahertz crystal. The signals $\overline{RESET}$, CYCLE, 60 HZ and INT are input signals for the microprocessor MP, they are interconnected with the following terminals respectively: RST, $\overline{INT1}$, T0, and T1. Output signals provided by the microprocessor MP are: $\overline{PSEN}$, ALE, $\overline{W}$, CLOCK, $\overline{WR}$ and $\overline{RD}$. These are developed at the $\overline{PSEN}$, ALE, $\overline{INTO}$, TXD, $\overline{WR}$ and $\overline{RD}$ terminals of the microprocessor MP, respectively. Furthermore, the front panel data line FP-DATA carries information both to and from the microprocesor MP at terminal RXD. The ADDRESS/DATA-BUS is interconnected with the microprocessor at terminals AD0 through AD7 thereof. Further address information is provided by the microprocessor MP at terminals A08 through A13 thereof. The previously described microprocessor link terminals P20 through P23 of the various port expanders PEX1 through PEX4 are interconnected respectively with terminals P10 through P13 of the microprocessor MP as described previously. The $\overline{PROGRAM}$ signal is developed at terminal P17 of microprocessor MP and the control lines for the terminals A, B and C of the port expander selector PEXS are connected to terminals P14, P15 and P16 of the microprocessor MP. With regard to the latch LAT, the terminals D10 through D17 thereof are interconnected with the ADDRESS/DATA-BUS. Latch output address information terminals A0 through A7 are connected by way of a DATA BUS with the input of the two previously described programmable read-only-memories UVPROM and NVRAM at terminals A0 through A7 thereof. Terminals 00 through 07 of the two previously described programmable memories UVPROM and NVRAM are also connected to the ADDRESS/DATA-BUS. Address information from terminals A08, A09 and A10 of the microprocessor MP are connected to the A8, A9 and A10 input terminals of the programmable read-only-memory UVPROM. The ALE signal from the microprocessor MP is connected to the STB input terminal of the latch LAT. The output A11 of the microprocessor MP is connected to the input terminal A11 of the UVPROM and to one input terminal of a two input nand gate NAND2. The A12 output terminal of microprocessor MP is connected to the A12 input terminal of UVPROM and to one input terminal of a two input nand gate NAND3. The $\overline{PSEN}$ signal from the microprocessor MP is connected to the other input terminal of each nand gate NAND2 and NAND3. The output of the nand gate NAND2 is the signal $\overline{AD\text{-}CS}$. The output of the nand gate NAND3 is connected to the $\overline{CE}$ input terminal of the NVRAM. The A13 terminal of the microprocessor MP is connected to the A13 terminal of the UVPROM. The $\overline{WR}$ and $\overline{RD}$ signals from the microprocessor MP are connected as described previously and to the $\overline{WE}$ and $\overline{OE}$ input terminals respectively of the NVRAM. As was described previously the ADDRESS/DATA-BUS is also connected to the A-D converter ADC.

Figure 8:
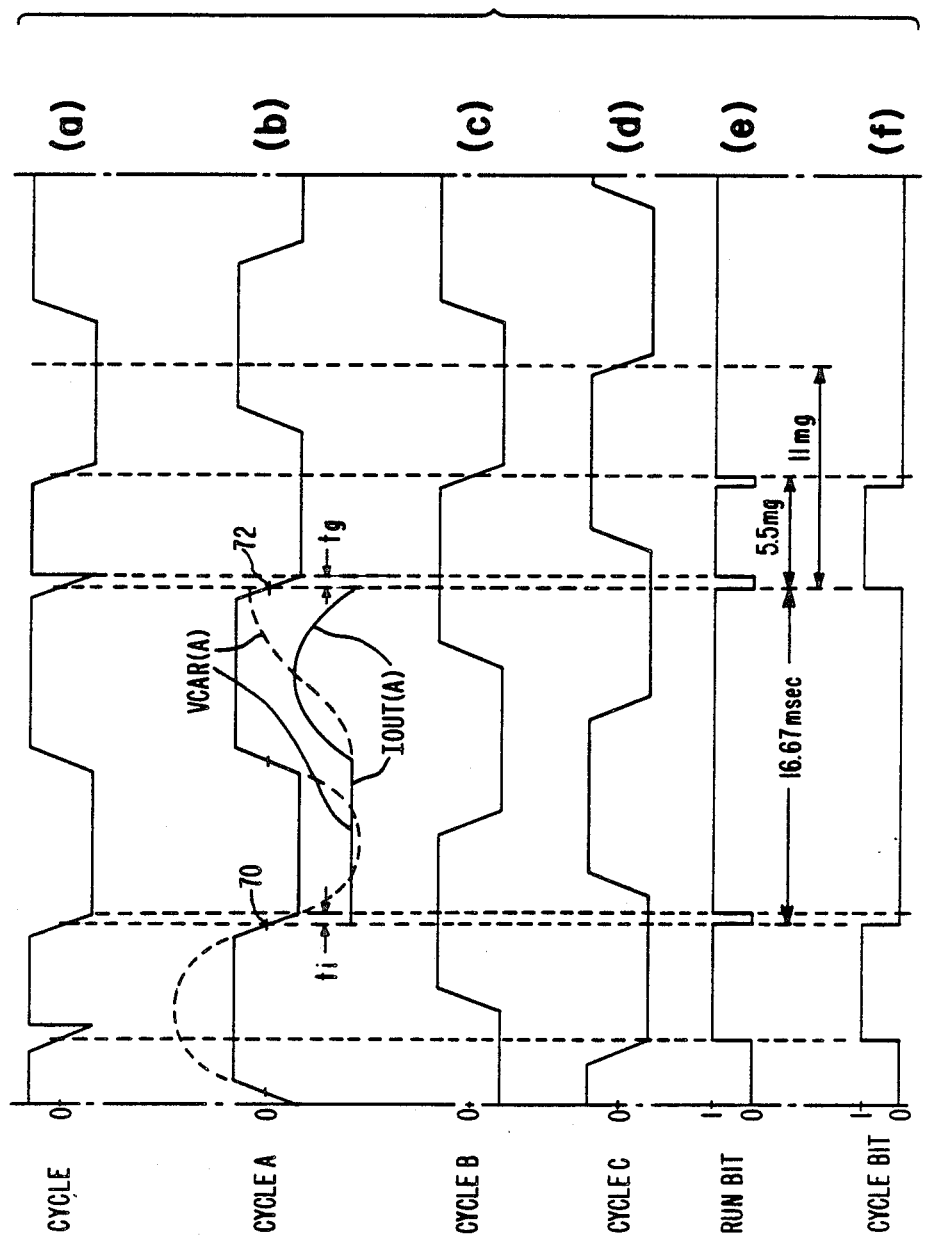
FIGS. 8 curves A through F show a timing diagram of the pulse arrangements and charging current and voltage for the ranging means of the embodiments of the present invention.
Figure 9:
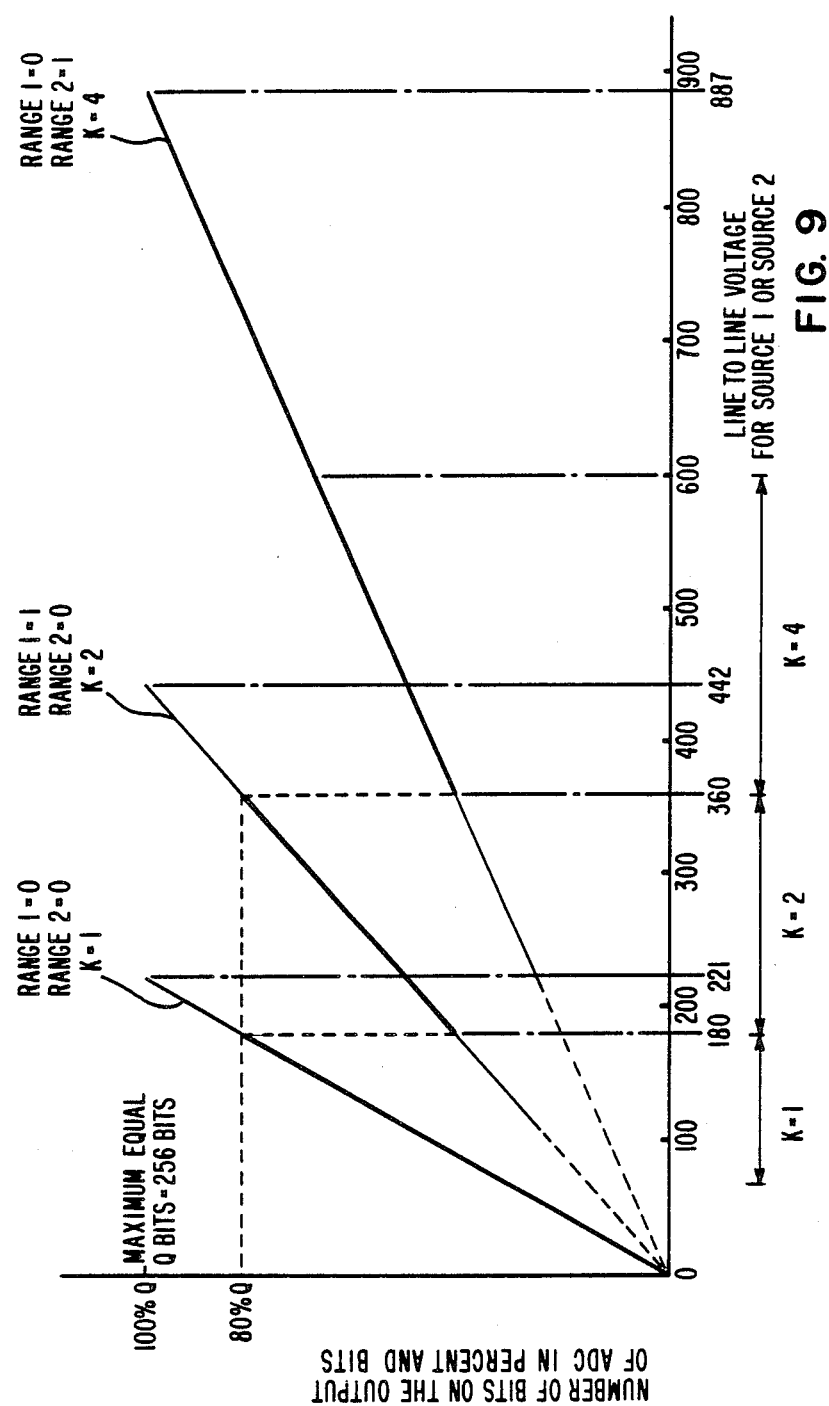
FIG. 9 shows a family of curves representing the ranging factors for the ranging device of the embodiments of the present invention.

Referring to FIG. 8, the relationship of the microprocessor MP and its timing cycles with respect to its inputs and outputs are shown. In particular, as soon as source power is initially supplied to the system, pin 16 on the semi-custom integrated chip SCIC, otherwise designated as the +5s input thereof is conditioned to sense when 5 volts from the power supply PS is present. When that happens, the RST output on pin 12 of the SCIC goes from a digital high to digital low or from +5 volts to 0 volts. This represents the RESET signal and is supplied to pin 9 of the microprocessor MP which is designated RST. When this happens, the microprocessor automatically goes to the restart location of its program at location 0000 and immediately thereafter starts running through its control program from the beginning. The microprocessor MP will also be reset to the 0000 location if the DEADMAN signal moves above or below its allocated frequency range as a function of the voltage provided to SCIC as determined by the charging network R5, R6 and C3. The DEADMAN signal is supplied to pin 11 of the semi-custom chip SCIC (the $\overline{RESTART}$ input). It comes from the microprocessor MP by way of the port expander PEX2. Typically, the DEADMAN signal has a 50% duty cycle. If its frequency becomes too fast (i.e. above 100 KHZ) or too slow (i.e. below 100 HZ), the cooperation of the associated capacitor C3 and the resistor R5 will cause the voltage at pin 11 to go up or down accordingly. If the voltage goes below a certain predetermined value which may be 1.5 V for 100 Hz, or above a certain predetermined value, which may be 2.5 V for 100 KHZ, then the semi-custom chip SCIC is alerted to provide the RESET output. Also, if power is shut off, the RESET will go down and the microprocessor MP will be reset.

Next the microprocessor MP checks the UVPROM memory. It does this by addressing UVPROM through the latch LAT. The eight bit address is on the ADDRESS/DATA-BUS terminals A0 through A7. This address also appears on the input of the latch LAT. At the initiation of the address latch enable signal ALE which is a high rising signal, the eight bits from terminals A0 through A7 are frozen on the output of the latch at terminals D00 through D07. This information is placed on the DATA BUS and the UVPROM is addressed on terminals A0 through A7 thereof. Since the latch LAT output has been frozen in time, the information on the ADDRESS/DATA-BUS can now change because the UVPROM continues to know what address the information is to be sent from. Concurrent with sending the eight bits of address information, other address information is sent in parallel therewith on lines A08 through A13 for subsequent use by the UVPROM. Also, since the UVPROM address has been latched in, the parallel data lines A0 through A7 can now be used to transfer data the other way, that is from the UVPROM to the microprocessor MP for use by the microprocessor in completing its program. The microprocessor MP does this by causing the $\overline{PSEN}$ signal to go low. This tells the UVPROM to go into a write mode so that the signals on lines AD0 through AD7 provide information back to the microprocessor on the ADDRESS/DATA-BUS via the terminals AD0 through AD7 of the microprocessor MP. The microprocessor MP then takes this eight bit software instruction and determines what it should next do. That information might tell the microprocessor MP, for example, to put out certain signals which initialize operations internal to the microprocessor MP.

The next typical thing for the microprocessor MP to do is to read the setpoints from the NVRAM. the microprocessor collaborates with the NVRAM in the same way it collaborates with the UVPROM, that is it initializes the NVRAM first by way of the latch LAT. It then selects the NVRAM for operation via the NAND gate NAND3 which provides an enabling signal as a function of the $\overline{PSEN}$ and A12 input signals. The only basic difference between operations of the NVRAM and the UVPROM is that the NVRAM is not only read from but it can be written to by the microprocessor MP. At this point in time, the NVRAM is read from and this is accomplished by utilizing the signal $\overline{RD}$ for reading initial setpoints from the NVRAM into the microprocessor's internal memory. When all the setpoints have been read, the microprocessor checks to see if they correspond with the desired setpoints which may have been newly added by the manipulation of the RAISE and LOWER front panel pushbuttons. The A12 signal basically indicates that the address to be used ranges from an address of 4096 to an address of 8191. Any address which is identified as A12 or larger, that is any address for which there is a digital 1 on the output of the terminal A12, will actuate the NVRAM. Any address below that will access the digital output information on the A-D converter ADC. It will be noted that this condition does not apply to dealing with the UVPROM or read only memory in which instructions for the microprocessor MP are stored. This only has to deal with choosing between going to memory locations in the A-D converter ADC, or memory locations in the NVRAM or the internal random access memory of the microprocessor itself. It is obvious that information which comes from the A-D converter ADC is going to be digital information associated with the voltages on phases A through C of a source. Information from the NVRAM has to do with setpoints as was described previously. As was mentioned previously the setpoint information comes from the front panel 16 by way of the FP-DATA input line for the microprocessor MP. Furthermore, that front panel information is temporarily stored within the random access memory of the microprocessor MP before it is sent to the NVRAM by way of the ADDRESS/DATA-BUS. At this point in the operation cycle, presume that the microprocessor MP has checked the NVRAM and has determined that the setpoint information stored therein is that which is desired, the microprocessor MP is now prepared to do a hardware initialization. What the microprocessor MP does at this time is test the output relays to determine if they are in the proper disposition. It starts by sampling the various inputs to the system as exemplified on the outputs of the latches LX1, LX2 and LX3. It will be recalled that these are digital signals which have been frozen in time by the raising of the INPUT-LATCH signal These signals are supplied to the microprocessor via the port expanders in a manner described previously. The microprocessor MP chooses which of these signals to bring in by iteratively sampling the port expanders PEX1 through PEX4. The appropriate microprocessor link lines P20, P21, P22 and P23 for each port expander is chosen iteratively for each port expander as a function of the port expander chip selector which supplies the port expander chip selecting signals $\overline{\text{OPTION-CS3}}$, $\overline{\text{CS0}}$, $\overline{\text{CS1}}$ and $\overline{\text{CS2}}$, for the port expanders PEX1 through PEX4, respectively. The input coding for the port expander chip selector is provided by the P14, P15 and P16 terminals of the microprocessor MP. The $\overline{\text{PROGRAM}}$ signal latches each port expander when it is time for a read or write operation. This information is stored within the internal random access memory of the microprocessor MP. These signals convey data related to the status of the various breakers such as MAIN 1, MAIN 2 or TIE. It also tells whether the system is in the AUTO, MANUAL or OFF state.

Referring now to FIGS. 5B, 5E, 5F and 8, the voltage sampling techniques is described. In particular, the CYCLE output signal provided by an oscillator SWGC which, in turn, receives input information from the I-SELECT signal from the operational amplifier OA1. The CYCLE signal is made from portions of the voltages from PHASES A through C of both SOURCE 1 and SOURCE 2, but for simplicity the operation associated with the signal I SELECT from PHASE A for one source only will be discussed in detail. The operation with respect to PHASE B and PHASE C is essentially the same. The microprocessor MP selects control signal V1-A (for PHASE A) for multiplex MX1. Thus phase Voltage PHASE A for SOURCE 1 is monitored. Capacitor C4 is reset in a manner previously described at a time represented by point 68 on curve B (CYCLE A). At the next downstroke at point 70 of the signal CYCLE A (corresponding to the voltage of PHASE A of SOURCE 1) the microprocessor MP is interrupted at the input terminal INT1 by the CYCLE A signal causing the microprocessor MP to immediately exit the routine it is in at the time and to go to a voltage reading subroutine. This is done by addressing the UVPROM for a very short period of time in order to receive and transmit voltage reading subroutine instructions therebetween. Also at this time, the microprocessor interrupt $\overline{\text{INT1}}$ is immediately internally reset for a subsequent interruption and the RUN BIT (CURVE B) in the microprocessor MP is set to 0. The SAMPLE signal is provided by the microprocessor MP to the multiplexers MX3, MX4, and MX5 as a digital 1 at this time to start a 1 cycle intepgration of the voltage signal IOUT in a manner previously described. After a short period of time ti the first part of the voltage reading subroutine ends and the microprocessor MP is alerted to the fact that the next downstroke of the CYCLE A signal will cause a different kind of interrupt than that which was previously provided by setting the CYCLE BIT (CURVE F) in the microprocessor to 0. Setting the CYCLE BIT to 0 alerts the microprocessor MP to the fact that an integration operation is proceeding and that the next downstroke of the CYCLE A curve will require an A to D conversion. At this time, the interrupt operation ceases and the microprocessor MP goes back into the subroutine it was in immediately prior to the previous interruption although the integration continues for a full cycle of line voltage. Furthermore, at the end of the aforementioned first part of the voltage reading subroutine, that is, at the end of the time ti the RUN BIT is reset to a digital 1. This starts a 20 millisecond overflow clock within the microprocessor MP the use of which will be described hereinafter. The time period ti may vary depending upon the tasks assigned to the subroutine in question. It may be approximately 40 to 50 microseconds. The period of the CYCLE A signal is approximately 16.67 milliseconds. The microprocessor MP will continue on in its normal routine while the integration is going on until the next downstroke of the previously described signal CYCLE A at point 72. When this happens the microprocessor is interrupted and the RUN BIT is set low or to digital 0 and the microprocessor MP enters a second part of the voltage reading interrupt subroutine. The RUN BIT stays low during the time tg. At point 72 the previously described A to D action is initiated in the analog to digital converted ADC by the microprocessor MP. This is done by producing the signal AD-CS. The peak of the integration curve VCAP(A) at point 72 is taken as an analog input to ADC in a manner described previously and an instant digital reading related thereto is provided on the output lines AD0–AD7 of ADC. The digital information is sent to the first eight bit locations AD0 through AD7 of the microprocessor MP. The microprocessor MP is alerted after communication with the UVPROM to now provide the control signal V1-B. The CYCLE signal will now be derived from the voltage from PHASE B rather than the voltage from PHASE A and is shown at curve C (CYCLE B) in FIG. 8. At the end of time tg the microprocessor MP is alerted to the fact that the next interrupt supplied on the $\overline{\text{INT1}}$ terminal will be an integration interrupt that is done by setting the CYCEL BIT to a digital 1. The RUN BIT is reset to a digital 1 at this time. When the next DOWNSTROKE of CYCLE B occurs the capacitor C4 will again be reset that is discharged through R7 and the operation will repeat itself in the manner previously described. This repeats again for the CURVE C after which the microprocessor MP operates to monitor the voltages of SOURCE 2 as provided at the output of the multiplexer MX2 for the voltages of PHASES A, B and C of SOURCE 2. These values are chosen by the control signals V2-A, V2-B and V2-C. All of the voltages represented by the first three integrations for PHASES A, B and C of SOURCE 1 are totalled and stored within the memory of the microprocessor MP. Likewise, all of the voltages with respect to SOURCE 2 of PHASES A, B and C are totalled and stored within the memory of the microprocessor MP for the SOURCE 2. The microprocessor keeps track of the fact that this is a first phase-by-phase voltage sampling for SOURCE 1 and a first phase-by-phase sampling for the voltages of SOURCE 2. The process is repeated once again with new voltages for the phases of SOURCE 1 being added to the old voltages for SOURCE 1 and the new voltages for the phases of SOURCE 2 being added to the old voltages for SOURCE 2. At the end of this time period, the microprocessor MP operates to divide the net total voltage for SOURCE 1 by 6 thus giving an average voltage value for SOURCE 1 and the net total voltage for SOURCE 2 by 6 thus giving an average voltage value for SOURCE 2. These values are then representative of the voltage values of SOURCE 1 and SOURCE 2 and are used in the routine for display and microprocessor control action is regard to the voltage on SOURCE 1 and the voltage on SOURCE 2. The A-D sampling and reset action for the multiplexers MX3, MX4 and MX5 take place almost instantaneously with the occurrence of a downstroke of an appropriately sampled CYCLE signal whereas the integration action takes place between the two aforementioned downstrokes. The control signals from the microprocessor MP which causes the integrate action are frozen by the microprocessor during the short period of time ti that the microprocessor is communicating with the UVPROM right after the first interrupt in the cycle of two interrupts thus allowing the microprocessor MP to jump out of the interrupt routine shortly after it has begun in a manner described previously without effecting the integration capabilities of the multiplexers MX3 through MX5 in a manner previously described. If during the normal sampling routine one of the cycle voltages is 0, the 20 millisecond clock timer started by setting the RUN BIT in the microprocessor to a digital 1 will overflow or time out, causing a voltage value of 0 to be stored in the microprocessor MP for this phase. This 0 value becomes one of the previously described six samples. If this did not happen, the interrupt routine would stay on one phase voltage indefinitely there being no available downstroke to trigger the next action. Also by measuring the time accumulated on the microprocessor clock which was started by setting the RUN BIT to a digital 1 each cycle at the end of the integration routine the exact frequency of the phase voltage can be determined and stored for use by microprocessor MP.

The 60 HZ signal is connected to the T0 timer interrupt input of the microprocessor MP. The microprocessor MP utilizes the 60 HZ interrupt to synchronize and run a 24-hour clock. Once each sixtieth cycle in conjunction with the front panel display interrupt, the NVRAM is addressed from the microprocessor MP as a function of the latter interrupt and a one second incremental value is supplied thereto thus storing real time on a one second by one second basis in the NVRAM. In the event that there is a power outage, the NVRAM has stored therein a time which is generally indicative of the time at which power outage or power down occurred and need not lose this time merely from loss of system power. The value of this lies in the fact that in most automatic transfer switch systems a mechanical clock or some similar clock is utilized on an incremental basis—that is once a week or once a month to exercise the energizing generator such as the generator G of FIG. 4. If it is desirable for example to exercise a generator once a week, it is necessary to maintain a clock and calendar system that allows the automatic transfer switch system to know when a week has expired. In the case of a short power outage or power down, the loss of fifteen minutes or so will not greatly affect the exercising profile of the system provided that accumulated time is maintained. When the system powers up again, time begins to accumulate again and the generator G will be exercised at about the correct time for exercising. The 24-hour clock information is also utilized when delays are necessary before breakers are to be closed or opened.

It can be seen that a natural sequence of events is normally followed by the microprocessor MP subject to the two interrupt functions described previously with respect to voltage sensing and 24-hour clock updating. Voltage sensing, incidentally, is the interrupt which always takes priority over the clock update interrupt. The next event in the sequence is to do what would normally be called calculations. At this point, the microprocessor will read whether it is to be in the OFF, MANUAL or AUTO state and display outputs as shown in CHART 1 as a function of what state it is in. If, for example, the operator places the key switch 20 in the PROGRAM mode, the microprocessor MP will switch into a setpoint programming routine. It determines to do this by reading the key switch 20, and by sampling the shift register SHR5 on a periodic basis as previously described. At this point, the microprocessor MP is alerted to bring the previously set setpoints out of the NVRAM and displays them on a front panel in a normal one second by one second sequence according to CHART 1 messages 1 through 40 and the previously described clock interrupt routine. This data is shifted to the front panel by way of the FF-DATA line. In the PROGRAM mode, the information will remain on the display 18 and the microprocessor MP will sample the pushbuttons or key switch 20 looking for a change of status. If there is RAISE input, the microprocessor MP will increase the value according to preset increments all the way to its maximum predetermined limit. That present setpoint values are taken from the NVRAM. If, on the other hand the pushbutton for LOWER is depressed, the microprocessor MP will decrement the value on the front panel according to the present increments all the way to its minimum limit. After incrementing or decrementing, the STEP pushbutton is depressed and the microprocessor goes to the next setpoint message in Chart 1. All of the front panel setpoint values are stored in the microprocessor's random access memory at this time. These are all of the setpoint values that were taken out of NVRAM immediately prior to this and adjusted up or down if ordered. When the operator is finished programming, he switches the key switch 20 to the OPERATION position. This sends a digital signal to shift register SHR5 by way of the FP-DATA line and allows the microprocessor MP to recognize that the key switch 20 has been placed in the OPERATION mode. At this point, all the new values for setpoints stored in the microprocessor memory are compared to what was previously stored in the NVRAM. When they are equal, the microprocessor MP recognizes that it does not have to write to a location to change a value. If they are not equal, the microprocessor realizes it must write a new setpoint in the NVRAM and does so. It does this by comparing address data, reads the information associated with the appropriate address data, sees if it is the same; if it is, it moves on; if it is not, it changes.

In addition to being able to control the entire system by switching the key switch 20 from the OPERATION to the PROGRAM mode and vice versa, switch 14 can be switched from the MANUAL to AUTO mode and vice versa. When the switch 14 is in the AUTO mode, the opening of the circuit breakers, the closing of circuit breakers and the like is controlled by the microprocessor MP. When the switch 14 is in the MANUAL mode, then the operator may exercise separate pushbuttons for control (not shown in FIG. 2), these are depicted as being interconnected to terminal board TB 10, terminals 9 through 14 for example, switches 40, 42, 44, 46, 48 and 50 for example or terminal board TB1C, terminals 10, 11 and 12 for example, as controlled by pushbuttons 32, 34 and 36 for example.

It should be understood that the square wave generator SWG which produces the CYCLE SIGNAL, the wave shaper and inverter WSI, the semi-custom integrated chip SCIC and the power supply PS are non-limiting herein and any devices which accomplish the purposes set forth herein for those portions of the circuit will be appropriate. It is to be understood that the semi-custom integrated chip SCIC is available on the open market in a form suitable for being custom altered, however, for purposes of this invention standard forms of alteration are suggested by the utilization of that circuit herein.

Chart 3 shows possible manufacturers and catalogue identification symbols for various integrated circuit devices which are utilized herein.

CHART 3

| REFERENCE SYMBOL | DESCRIPTION | MANUFACTURE | CATALOGUE ID |
|---|---|---|---|
| OC1 | DUAL OPTOCOUPLER | SIEMENS | ILD-1 |
| NURAM | NVRAM | XICOR | X2804A |
| PEX1-PEX4 | I/O PORT EXPANDER | NEC | 82C43 |
| MP | MICROCONTROLLER | INTEL | 80C31 |
| VPROM | UVROM | INTEL | 27128 |
| LAT | 8 BIT LATCH | NATIONAL | 74HCT373 |
| PEXS | 8 TO 1 DECODER | NATIONAL | 74HCT138 |
| HANDGATES | QUAD NAND | NATIONAL | 74HCT132 |
| ANDGATES | QUAD AND | NATIONAL | 74HCT08 |
| IN1 | HEX OPEN C INVERTER | TI | 74 ALS05 |
| MX1-MX5 | MULTIPLEXER | MOTOROLA | MC14053BCL |
| SR1, SR2 | 4 BIT COUNTER | MOTOROLA | MC14516BCL |
| INV1, INV2 | QUAD SCHMIT NAND | MOTOROLA | MC14093BCL |
| LX1-LX5 | 4 BIT LATCH | MOTOROLA | MC14042BCL |
| ADC | A TO D CONVERTER | NATIONAL | ADC0844 |
| OC2 | OPTOCOUPLED SCR | GI | MCS2400 |
| OA1 | DUAL OPAMP | TI | TL0821J |
| SCIC | SEMI-CUSTOM | MCE | W641 |

We claim:

1. An electrical transfer switch of a type which performs an electrical function as a result of sensed line voltage on an electrical line, comprising:
   voltage sensing means interconnected with said line for providing a voltage sensing means output current which is related to said line voltage;
   ranging means interconnected with said voltage sensing means for receiving said voltage sensing means output current as an input therefor and for providing a related ranging means output current which is a predetermined fraction (1/K) of said voltage sensing means output current;
   integrating means interconnected with said ranging means for receiving said ranging means output current as an input therefor and for integrating said latter current over a predetermined period of time for providing an output analog voltage at the end of said period of time which is related to said line voltage;
   analog-to-digital converter means interconnected with said integrating means for converting said analog voltage to a digital number, the maximum value of said digital number not exceeding Q bits;
   function means interconnected with said analog-to-digital converter means for utilizing said digital number as an input and for performing said electrical function in relationship to said digital number; and
   control means interconnected with said ranging means and said function means for reducing said fraction (1/K) by a predetermined amount when the maximum value of said line voltage is in a range which will cause said analog voltage to be of a value which will lead to a digital number which exceeds Q bits while concurrently causing said function means to increase the value attributed to said digital number by said predetermined amount to compensate for the reduction.

2. The electrical transfer switch as claimed in claim 1, wherein K is an integer.

3. The electrical transfer switch as claimed in claim 2, wherein K is predetermined for given ranges of said line voltage.

4. The electrical transfer switch as claimed in claim 3, wherein K equals 1, 2 or 4.

5. An electrical transfer switch which performs an electrical function as a result of sensed line voltage on an electrical line, comprising:
   voltage sensing and ranging means interconnected with said line for providing an output analog voltage which is related to said sensed voltage by a ranging value (1/K);
   analog-to-digital converter means interconnected with said voltage sensing and ranging means for receiving said output analog voltage and for converting it to a digital number, the maximum value of said digital number not exceeding Q bits;
   input means for providing a signal indicative of a maximum expected value of said line voltage during an operating period; and
   microprocessor means with memory interconnected with said voltage sensing and ranging means, said analog-to-digital converter means and said input means for determining the highest value of K from a menu of discrete values of K contained therein, where said highest value of K is related to the highest value of line voltage which is expected during said operating period, wherein K will provide a range of digital numbers which are related to said sensed line voltage and wherein none of said digital numbers will exceed said q bits, said microprocessor means internally multiplying said digital numbers by K to perform said function.

6. The electrical transfer switch as claimed in claim 5, wherein K is an integer.

7. The electrical transfer switch as claimed in claim 6, wherein K is 1, 2 or 4.

* * * * *